United States Patent
Choi et al.

(10) Patent No.: US 9,530,729 B2
(45) Date of Patent: Dec. 27, 2016

(54) SEMICONDUCTOR DEVICES INCLUDING INSULATING EXTENSION PATTERNS BETWEEN ADJACENT LANDING PADS AND METHODS OF FABRICATING THE SAME

(71) Applicants: Yong-gyu Choi, Seongnam-si (KR); Hyun-chul Kim, Seoul (KR); Seung-hee Ko, Seogwipo-si (KR)

(72) Inventors: Yong-gyu Choi, Seongnam-si (KR); Hyun-chul Kim, Seoul (KR); Seung-hee Ko, Seogwipo-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/859,435

(22) Filed: Sep. 21, 2015

(65) Prior Publication Data

US 2016/0013131 A1 Jan. 14, 2016

Related U.S. Application Data

(63) Continuation of application No. 14/445,829, filed on Jul. 29, 2014, now Pat. No. 9,165,934.

(30) Foreign Application Priority Data

Aug. 30, 2013 (KR) .................. 10-2013-0104504

(51) Int. Cl.
*H01L 23/522* (2006.01)
*H01L 23/528* (2006.01)
(Continued)

(52) U.S. Cl.
CPC ......... *H01L 23/5228* (2013.01); *H01L 23/528* (2013.01); *H01L 23/5226* (2013.01);
(Continued)

(58) Field of Classification Search
CPC .................................................. H01L 27/10814
See application file for complete search history.

(56) References Cited

U.S. PATENT DOCUMENTS 8,034,714 B2 10/2011 Hwang
2010/0285662 A1* 11/2010 Kim .................... H01L 21/7682
438/675

(Continued)

FOREIGN PATENT DOCUMENTS

JP 2003-158201 5/2003
KR 10-1116310 10/2009
(Continued)

*Primary Examiner* — Erik Kielin
(74) *Attorney, Agent, or Firm* — Myers Bigel, P.A.

(57) ABSTRACT

A semiconductor memory device includes a plurality of pattern structures respectively including a bit line and insulating spacers on sidewalls thereof protruding from a substrate. A plurality of insulating extension patterns are provided on opposing sidewalls of the pattern structures, and respectively extend from upper portions of the opposing sidewalls toward the substrate along the insulating spacers such that lower portions of the opposing sidewalls are free of the extension patterns. A plurality of buried contact patterns are provided on the substrate between the lower portions of the opposing sidewalls of adjacent pattern structures. Related fabrication methods are also discussed.

20 Claims, 41 Drawing Sheets

(51) Int. Cl.
*H01L 27/108* (2006.01)
*H01L 27/02* (2006.01)
*H01L 21/768* (2006.01)

(52) U.S. Cl.
CPC .... *H01L 27/0207* (2013.01); *H01L 27/10814* (2013.01); *H01L 27/10823* (2013.01); *H01L 27/10855* (2013.01); *H01L 27/10876* (2013.01); *H01L 21/76897* (2013.01); *H01L 2924/0002* (2013.01)

(56) References Cited

U.S. PATENT DOCUMENTS

| | | |
|---|---|---|
| 2011/0143509 A1* | 6/2011 | Fujimoto .......... H01L 27/10876 438/270 |
| 2012/0049275 A1 | 3/2012 | Hashitani |
| 2012/0187535 A1 | 7/2012 | Lee |
| 2012/0286354 A1 | 11/2012 | Cho |
| 2012/0299073 A1 | 11/2012 | Mikasa |
| 2013/0009226 A1 | 1/2013 | Park et al. |
| 2013/0292847 A1 | 11/2013 | Choi et al. |
| 2014/0327063 A1 | 11/2014 | Park |

FOREIGN PATENT DOCUMENTS

| | | |
|---|---|---|
| KR | 10-1087779 | 3/2011 |
| KR | 20120086637 | 8/2012 |
| KR | 20120103246 | 9/2012 |

* cited by examiner

SEMICONDUCTOR DEVICES INCLUDING INSULATING EXTENSION PATTERNS BETWEEN ADJACENT LANDING PADS AND METHODS OF FABRICATING THE SAME

CROSS-REFERENCE TO RELATED APPLICATIONS

This application is a continuation of U.S. patent application Ser. No. 14/445,829, filed Jul. 29, 2014, which claims priority under 35 U.S.C. §119 to Korean Patent Application No. 10-2013-0104504 filed on Aug. 30, 2013, the disclosures of which are hereby incorporated herein by reference in their entireties.

BACKGROUND

The inventive concept relates to semiconductor devices and methods of fabricating the same, and more particularly, to semiconductor devices including conductive patterns that are electrically connected to contact patterns that are three-dimensionally disposed between pattern structures, and a methods of fabricating the same.

As the degree of integration of semiconductor devices increases, the design rule for components of a semiconductor device may decrease, and a device height may also increase. In a highly integrated semiconductor device, it may be complicated and/or difficult to form conductive patterns that are to be electrically connected to contact patterns disposed between pattern structures.

SUMMARY

Embodiments of the inventive concept provide a semiconductor device capable of reducing formation of bridges between conductive patterns that are electrically connected to contact patterns disposed between pattern structures.

Embodiments of the inventive concept provide a semiconductor device capable of reducing contact resistance of conductive patterns that are electrically connected to contact patterns disposed between pattern structures.

Embodiments of the inventive concept provide methods of manufacturing a semiconductor device, whereby a misalignment margin between pattern structures and conductive patterns electrically connected to contact patterns disposed between the pattern structures may be increased.

According to some embodiments of the inventive concepts, semiconductor memory device includes a plurality of pattern structures protruding from a surface of a substrate. The pattern structures respectively include a bit line and insulating spacers on sidewalls of the bit line extending along the surface of the substrate. The pattern structures may be spaced apart along a first direction, and may extend in a second direction along the substrate surface. A plurality of insulating extension patterns extend on opposing sidewalls of the pattern structures. The extension patterns respectively extend from upper portions of the opposing sidewalls toward the substrate along the insulating spacers, such that lower portions of the opposing sidewalls are free of the extension patterns. A plurality of buried contact patterns are provided on the substrate between the lower portions of the opposing sidewalls of adjacent ones of the pattern structures.

In some embodiments, a plurality of conductive landing pads may respectively extend from the upper portions of one of the opposing sidewalls of the respective pattern structures along the extension patterns to contact the buried contact patterns. The conductive landing pads may extend between or otherwise separate the extension patterns from the buried contact patterns.

In some embodiments, the upper portions of another of the opposing sidewalls of the respective pattern structures may be free of the conductive landing pads, which may prevent the formation of bridges between the landing pads.

In some embodiments, a distance between the lower portions of the opposing sidewalls of the adjacent ones of the pattern structures may be greater than a distance between the extension patterns on the upper portions thereof. The distance between the lower portions of the opposing sidewalls of the adjacent ones of the pattern structures may define a larger contact area for one of the buried contact patterns therebetween than the distance between the upper portions thereof.

In some embodiments, the upper portions of the opposing sidewalls of the pattern structures may be oblique or inclined relative to a surface of the substrate. The sidewalls of the extension patterns on the opposing sidewalls of the pattern structures may be substantially perpendicular to the surface of the substrate.

In some embodiments, a plurality of capacitor electrodes may be provided on the pattern structures. The conductive landing pads may electrically connect respective ones of the capacitor electrodes to respective ones of the buried contact patterns.

According to an aspect of the inventive concept, there is provided a semiconductor device including a plurality of pattern structures that are spaced apart from one another on a support layer in a first direction and extend in a second direction perpendicular to the first direction, wherein an upper width of the pattern structures in the first direction is smaller than a lower width of the pattern structures; a plurality of extension patterns that extend on two sidewalls of each of the plurality of pattern structures in the second direction, wherein an upper width of the extension patterns in the first direction is greater than a lower width of the extension patterns; a plurality of contact patterns that are spaced apart from one another on the support layer in the first direction and the second direction between the pattern structures and the extension patterns; and a plurality of conductive patterns that cover upper and lateral surfaces of the pattern structures and the extension patterns and are electrically connected to the contact patterns.

The plurality of pattern structures and the plurality of extension patterns may include line-type patterns extending in the second direction. The conductive patterns may include island-type patterns that are spaced apart from one another in the first direction and the second direction. The pattern structures may include at least one spacer formed in an outermost portion extending in the second direction.

The extension patterns may include extension spacers formed on the at least one spacer. Lower distances between the extension patterns on the contact patterns may be greater than upper distances between the extension patterns. The pattern structures may include body patterns and at least one spacer formed on two sidewalls of each of the body patterns.

One of the at least one spacer of the pattern structures may include an air spacer. The conductive patterns may be alternately arranged in a zigzag form along the second direction on right and left sidewalls of each of the pattern structures and the extension patterns.

According to another aspect of the inventive concept, there is provided a semiconductor device including: a plurality of pattern structures that are spaced apart from one another on a support layer and include at least one spacer having an upper width smaller than a lower width; a plurality of extension patterns formed on the at least one spacer of the pattern structures, wherein an upper width of the extension patterns is greater than a lower width of the extension patterns; a plurality of contact patterns formed on the support layer between the pattern structures and the extension patterns; and a plurality of conductive patterns that cover upper and lateral surfaces of the pattern structures and are electrically connected to the contact patterns.

A spacer included in the pattern structures may include a multi-layer spacer including an air spacer. The extension patterns may have a vertical profile. The extension patterns may include extension spacers formed on the at least one spacer included in the pattern structures.

The extension patterns may be formed in an upper area on the pattern structures and in an intermediate area below the upper area of the pattern structures.

According to another aspect of the inventive concept, there is provided a semiconductor device including a plurality of word lines that extend on a substrate along a first direction and are spaced apart from one another in a second direction perpendicular to the first direction; a plurality of bit line structures that extend perpendicularly to the word lines and are spaced apart from one another in the first direction; at least one spacer formed on two sidewalls of each of the bit line structures, wherein an upper width of the at least one spacer is smaller than a lower width of the at least one spacer; a plurality of contact patterns spaced apart from one another on the substrate between the word lines and between the bit line structures; a plurality of extension spacers formed on two sides of the spacer, wherein an upper width of the extension spacers is greater than a lower width of the extension spacers; and a plurality of landing pads that cover upper and lateral surfaces of the bit line structures, the at least one spacer, and the extension spacers, and are electrically connected to the contact patterns.

The total or combined upper width of the bit line structures and the extension spacers may be greater than a total lower width. The at least one spacer formed on the two sidewalls of each of the bit line structures may include an air spacer.

An open surface area of the contact patterns that is opened by the extension spacers may be greater in a lower portion than in an upper portion. A contact surface area between the landing pads and the contact patterns may be greater in a lower portion than in an upper portion of the bit line structures and the spacers.

The landing pads may be alternately arranged in a zigzag form along the second direction on right and left sidewalls of each of the pattern structures and the extension patterns.

According to another aspect of the inventive concept, there is provided a method of manufacturing a semiconductor device, the method including forming a plurality of pattern structures that are spaced apart from one another on a support layer and include at least one spacer having an upper width that is smaller than a lower width; forming a plurality of contact patterns that are formed on the support layer between the pattern structures at a lower height than the pattern structures; forming a plurality of extension patterns on the at least one spacer of the pattern structures, wherein the plurality of extension patterns have an upper width greater than a lower width; and forming a plurality of conductive patterns that cover upper and lateral surfaces of the pattern structures and are electrically connected to the contact patterns.

The at least one spacer included in the pattern structures may be formed of a multi-layer spacer, and an air spacer may be formed in the multi-layer spacer.

The forming of the extension patterns may include forming an extension layer having an upper width greater than a lower width, on the pattern structures and the contact patterns, by adjusting step coverage such that the upper width of the extension patterns is greater than the lower width of the extension patterns; and completing the extension patterns on the at least one spacer of the pattern structures by etching the extension layer.

The forming of the extension layer may be performed using a cyclic chemical vapor deposition (CVD) method. The extension patterns may be formed in an upper area on the pattern structures and in an intermediate area below the upper area of the pattern structures, and reinforcement extension patterns may be formed in a region below the intermediate area on the pattern structures.

According to another aspect of the inventive concept, there is provided a semiconductor device including a plurality of pattern structures that are spaced apart from one another on a support layer in a first direction and extend in a second direction perpendicular to the first direction, wherein an upper width of the pattern structures in the first direction is smaller than a lower width of the pattern structures; a plurality of extension patterns that extend on two sidewalls of each of the pattern structures in the second direction, wherein an upper width of the extension patterns in the first direction is greater than a lower width of the extension patterns; and a plurality of conductive patterns that cover upper and lateral surfaces of the pattern structures and the extension patterns and that are electrically insulated from one another.

The pattern structures may include a body conductive pattern and an insulation pattern formed on the body conductive pattern, and the extension patterns may be formed on an upper portion of a sidewall of the insulation pattern.

The pattern structures may include a bit line, and the extension patterns may include a spacer formed on a sidewall of the bit line.

The pattern structures may include a bit line, and a buried contact may be formed on the support layer between the bit lines at a height lower than the bit line.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
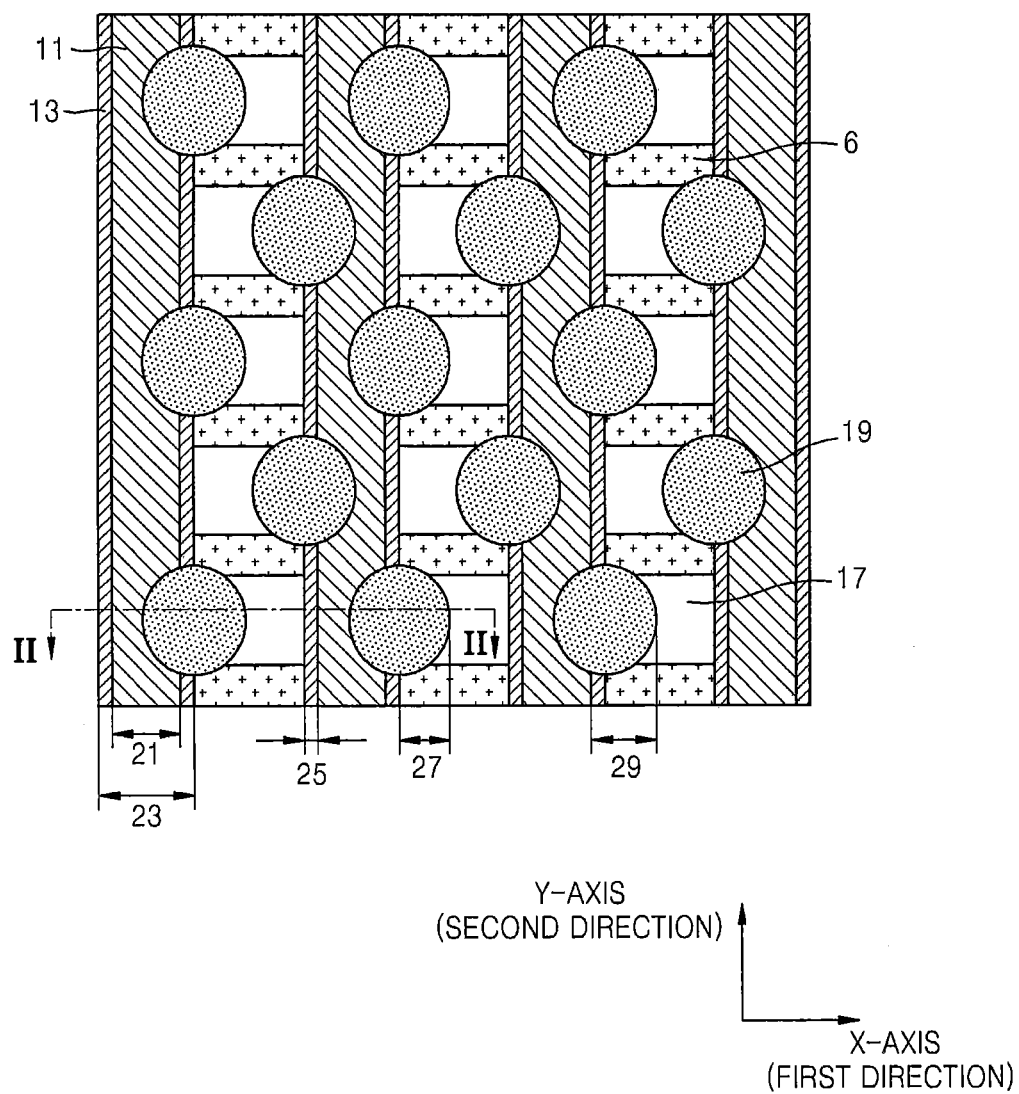
FIG. 1 is a layout diagram illustrating a semiconductor device according to some embodiments of the inventive concept.

Hereinafter, the inventive concept will be described more fully with reference to the accompanying drawings, in which exemplary embodiments of the inventive concepts are shown. This invention may, however, be embodied in many different forms and should not be construed as limited to the exemplary embodiments set forth herein. Rather, these embodiments are provided so that this disclosure will be thorough and complete, and will fully convey the scope of the inventive concepts to those of ordinary skill in the art.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

It will also be understood that when an element is referred to as being "on" or "connected to" another element, it can be directly on or connected to the other element, or intervening elements may be present. In contrast, when an element is referred to as being "directly on" or "directly connected to" another element, there are no intervening elements present. It will also be understood that the sizes and relative orientations of the illustrated elements are not shown to scale, and in some instances they have been exaggerated for purposes of explanation.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The terms used herein are for illustrative purposes only and should not be construed to limit the meaning or the scope of the inventive concept as described in the claims.

As used herein, the term "and/or" includes any and all combinations of one or more of the associated listed items. Expressions such as "at least one of," when preceding a list of elements, modify the entire list of elements and do not modify the individual elements of the list.

Figure 2:
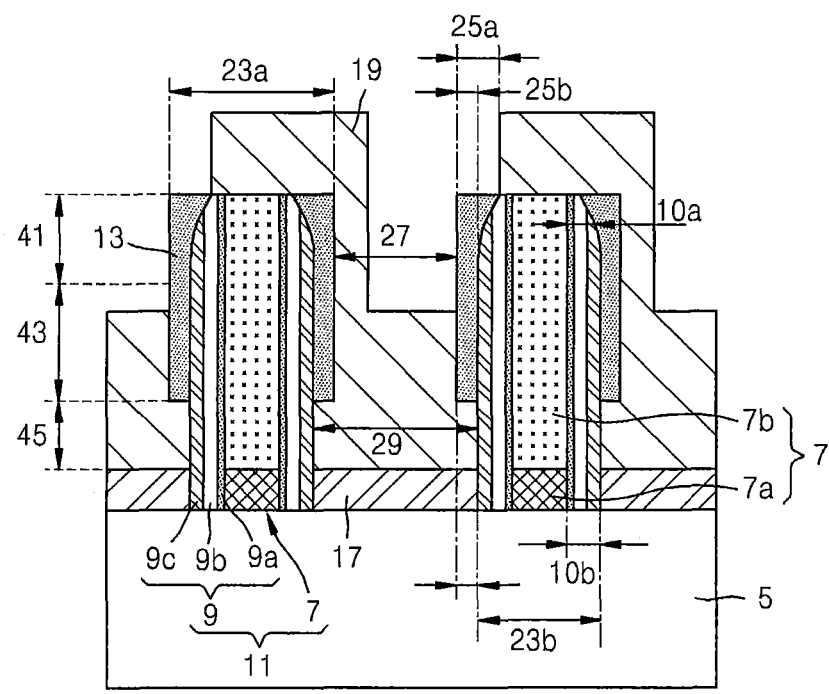
FIG. 2 is a cross-sectional view of the semiconductor device of FIG. 1 taken along a line II-II, according to some embodiments of the inventive concept.
Figure 2:
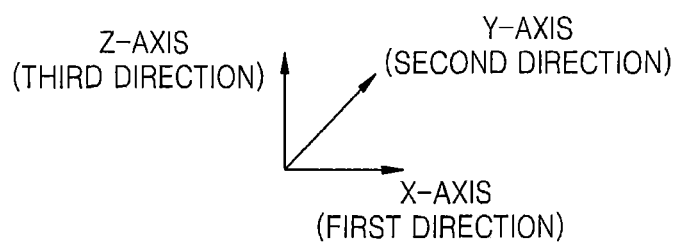

FIG. 1 is a layout diagram illustrating a semiconductor device according to some embodiments of the inventive concept in plan view. FIG. 2 is a cross-sectional view of the semiconductor device of FIG. 1 taken along a line II-II, according to some embodiments of the inventive concept.

In detail, a plurality of first pattern structures 6 that extend in a first direction (X-axis direction) and are spaced apart from one another in a second direction (Y-axis direction) perpendicular to the first direction are formed on a support layer 5. The support layer 5 may be a substrate or an insulation layer. The first pattern structures 6 may be word lines. The first pattern structures 6 may be line-type patterns extending in the first direction.

A plurality of second pattern structures 11 that are spaced apart from one another in the first direction (X-axis direction) and extend in the second direction (Y-axis direction) perpendicular to the first direction are formed on the support layer 5. The second pattern structures 11 may be line-type patterns that extend in the second direction. The second pattern structures 11 may include bit line structures (or bit lines) and spacers formed on two sidewalls of each of the bit line structures in a semiconductor device. The first pattern structures 6 and the second pattern structures 11 may be insulated from each other by using an insulation layer.

The second pattern structures 11 may include at least one spacer 9 in an outermost portion extending in the second direction (Y-axis direction). The second pattern structures 11 may include body patterns 7 and at least one spacer 9 that are formed on each of two sidewalls of the body patterns 7 as illustrated in FIG. 2. The body patterns 7 may be bit line structures of a semiconductor device. The body patterns 7 may include conductive patterns 7a (body conductive patterns) and insulating patterns 7b formed on the conductive patterns 7a.

The spacer 9 may have an upper width or thickness 10a in the first direction that is smaller or narrower than a lower width or thickness 10b. The upper width or thickness 10a of the spacer 9 may be decreased as the spacer 9 is etched in a semiconductor manufacturing process. Accordingly, the second pattern structures 11 including the spacer 9 may also have an upper width or thickness that is smaller or narrower than a lower width or thickness in the first direction.

The spacer 9 may be a multi-layer spacer. The spacer 9 may be an insulation layer spacer. The spacer 9 may include a first spacer 9a, a second spacer 9b, and a third spacer 9c that are sequentially formed on two sidewalls of the body patterns 7. The first spacer 9a and the third spacer 9c may be formed of a nitride layer. The second spacer 9b may be formed of an oxide layer. One of the first, second, and third spacers 9a, 9b, and 9c of the spacer 9 of the second pattern structures 11 may be an air spacer. For example, the second spacer 9b may be an air spacer.

As illustrated in FIG. 1, extension patterns 13 extending in the second direction on two sidewalls of each of the second pattern structures 11 are formed. The extension patterns 13 may be line-type patterns extending in the second direction. The extension patterns 13 may be extension spacers formed on two sidewalls of each of bit line structures (or bit line patterns).

As illustrated in FIG. 2, the extension patterns 13 are formed on two opposing sidewalls of each of the second pattern structures 11 at a height equal to a surface of the second pattern structures 11 in a third direction (Z-axis direction). The third direction (Z-axis direction) may be perpendicular to a plane formed by the first direction (X-axis direction) and the second direction (Y-axis direction). The extension patterns 13 may be formed on the spacer 9 of the second pattern structures 11. The extension patterns 13 may have a vertical profile. The extension patterns 13 may be extension spacers formed on the spacer 9 of the second pattern structures 11.

As illustrated in FIG. 2, the extension patterns 13 are formed at the same height as a surface of the second pattern structures 11 and an upper width 25a of the extension patterns 13 in the first direction is greater than a middle width 25b.

Referring to FIG. 2, elements denoted by reference numerals 41, 43, and 45 may be respectively an upper region, an intermediate region, and a lower region of the second pattern structures 11. The extension patterns 13 may be formed in the upper region 41 of the second pattern structures 11 and in the intermediate region 43 below the upper region 41 of the second pattern structures 11. According to some embodiments of the inventive concept, the extension patterns 13 may also be formed in the lower region 45 of the second pattern structures 11.

A total or combined upper width 23a of the second pattern structures 11 and the extension patterns 13 may be greater than a total lower width 23b of the second pattern structures 11 and the extension patterns 13. In FIG. 2, although a reference numeral 23b indicates only a width of the second pattern structures 11, the extension patterns 13 may also be formed in the lower region 45 of the second pattern structures 11, and thus, the total lower width 23b may also be the total width of the second pattern structures 11 and the extension patterns 13.

By forming the extension patterns 13 on two sides of each of the second pattern structures 11, upper surface areas of the second pattern structures 11 and the extension patterns 13 may be increased so that sidewall inclination profiles of the second pattern structures 11 and the extension patterns 13 may be vertical.

When the upper surface areas of the second pattern structures 11 and the extension patterns 13 are increased, a misalignment margin between the second pattern structures 11 and conductive patterns 19 may be increased when forming the conductive patterns 19 by using a photolithography method in a subsequent operation.

Also, when the sidewall inclination profiles of the second pattern structures 11 and the extension patterns 13 are vertical, formation of bridges between the conductive patterns 19 may be reduced or prevented when forming the conductive patterns 19 using a photolithography method in a subsequent operation.

A plurality of contact patterns 17 are spaced apart from one another on the support layer 5 in the first and second directions between the second pattern structures 11 and the extension patterns 13. The contact patterns 17 may be formed between the first pattern structures 6. The contact patterns 17 may be contact plugs. The contact patterns 17 may be buried contact (BC) contacts in a semiconductor device. The contact patterns 17 may be formed of a conductive layer.

A lower distance 29 between the second pattern structures 11 and the extension patterns 13 on the contact patterns 17 may be greater than an upper distance 27 due to the extension patterns 13.

In other words, due to the extension patterns 13, the upper surface areas of the second pattern structures 11 and the extension patterns 13 may be relatively large, and lower surface areas of the second pattern structures 11 and the extension patterns 13 may be relatively small. Accordingly, an open surface area of the contact patterns 17 located between the second pattern structures 11 and the extension patterns 13 may be greater in a lower portion than in an upper portion. When the open surface area of the contact patterns 17 is greater in the lower portion than in the upper portion, contact resistance of the conductive patterns 19 may be reduced.

A plurality of conductive patterns 19 that cover upper and lateral surfaces of the contact patterns 17 on the second pattern structures 11 and the extension patterns 13 and are electrically connected to the contact patterns 17 are formed. The conductive patterns 19 may be formed by forming a conductive material on the entire surface of the support layer 5, on which the first pattern structure 6, the second pattern structures 11 and the extension patterns 13, and the contact patterns 17 are formed, and patterning the conductive material layer using a photolithography method.

The conductive patterns 19 may be island-type patterns that are spaced apart from one another in the first and second directions. The conductive patterns 19 may be landing pads in a semiconductor device. As described above, the conductive patterns 19 may prevent formation of bridges and may also reduce contact resistance due to the extension patterns 13 which have a greater upper width than a lower width.

Figure 3:
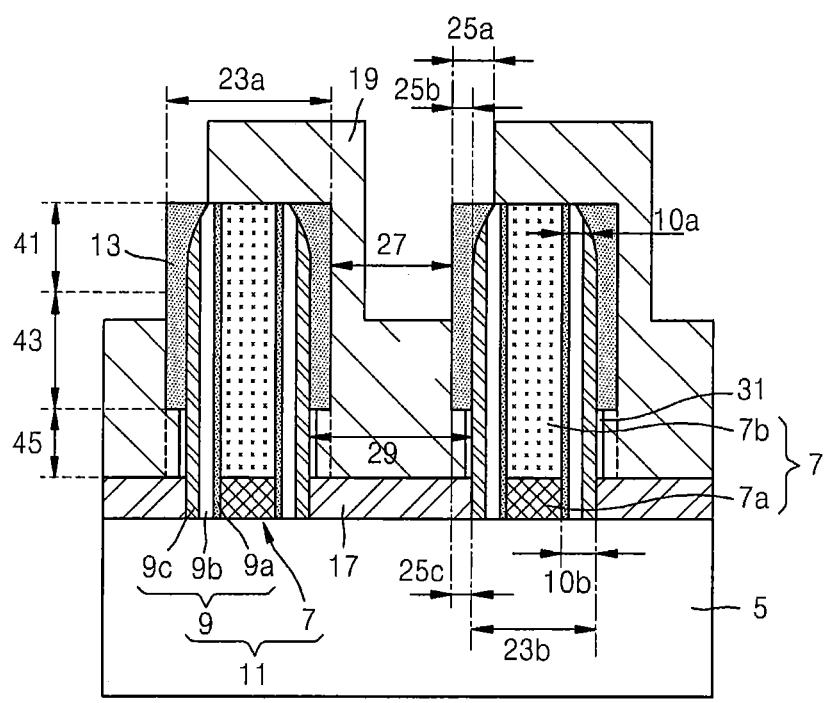
FIG. 3 is a cross-sectional view of a semiconductor device according to some embodiments of the inventive concept.
Figure 3:
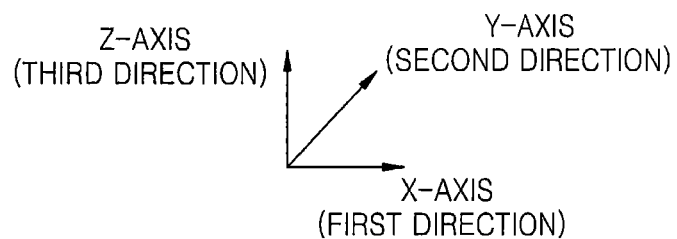

FIG. 3 is a cross-sectional view of a semiconductor device according to some embodiments of the inventive concept.

In detail, FIG. 3 is a cross-sectional view taken along a line II-II of FIG. 1. Compared to FIG. 2, the semiconductor device of FIG. 3 is similar to the semiconductor device of FIG. 2 except that reinforcement extension patterns 31 are further formed in the lower region 45 of the second pattern structures 11.

The semiconductor device of FIG. 3 includes the reinforcement extension patterns 31 in the lower region 45 of the second pattern structures 11. The reinforcement extension patterns 31 are formed on sidewalls of the spacer 9 included in the second pattern structures 11. The reinforcement extension patterns 31 may be formed of a nitride layer.

As denoted by a dotted line, the reinforcement extension patterns 31 may have various widths or thicknesses. For example, a width 25c of the reinforcement extension patterns 31 may be the same as the middle width 25b of the extension patterns 13. The width of the reinforcement extension patterns 31 may be smaller or narrower than the middle width 25b of the reinforcement extension patterns 31. The reinforcement extension patterns 31 may be formed to reinforce the lower region 45 of the second pattern structures 11. The reinforcement extension patterns 31 may be formed of a nitride layer.

FIGS. 4 through 7 are cross-sectional views illustrating a method of fabricating a semiconductor device according to some embodiments of the inventive concept. FIGS. 4 through 7 may be cross-sectional views of the semiconductor device of FIG. 1 taken along a line II-II, and like reference numerals as in FIGS. 1 through 3 denote like elements.

Figure 4:
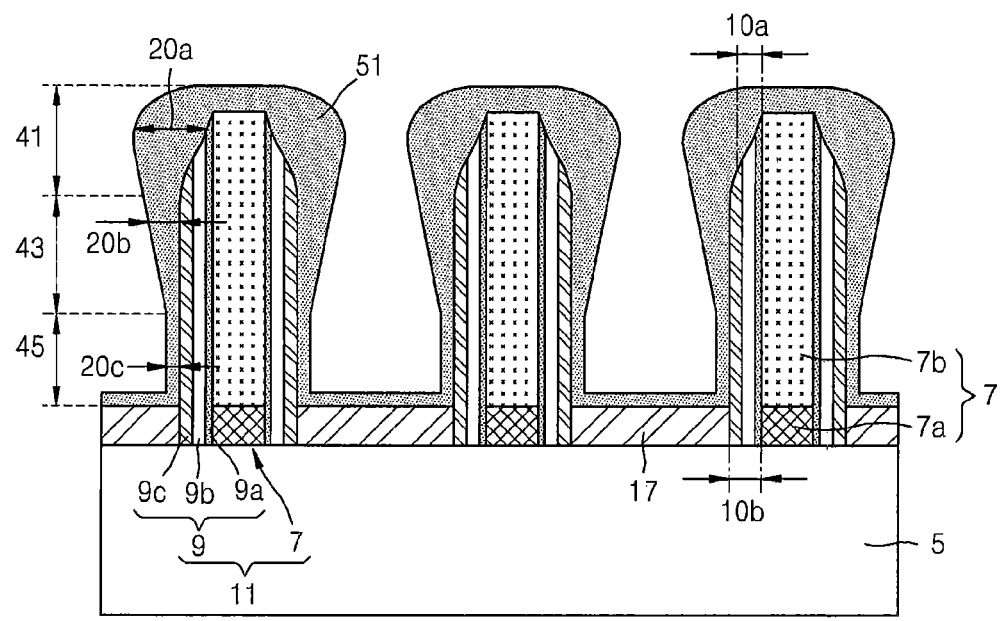
FIGS. 4 through 7 are cross-sectional views illustrating a method of fabricating a semiconductor device according to some embodiments of the inventive concept.

Referring to FIG. 4, the second pattern structures 11 are formed on the support layer 5. As described above, the second pattern structures 11 may include the body patterns 7 and the spacer 9 formed on two sidewalls of each of the body patterns 7. The body patterns 7 may include conductive patterns 7a and insulation patterns 7b formed on the conductive patterns 7a.

The spacer 9 may include a first spacer 9a, a second spacer 9b, and a third spacer 9c. The spacer 9 may have an upper width or thickness 10a that is smaller or narrower than a lower width or thickness 10b. The upper width 10a of the spacer 9 may be reduced as the spacer 9 is etched during a semiconductor manufacturing process.

Contact patterns 17 are formed between the second pattern structures 11 on the support layer 5. The contact patterns 17 may be formed by forming a conductive material layer on the entire surface of the support layer 5 on which the second pattern structures 11 are formed, and then performing an etch-back process. The contact patterns 17 may be contact plugs.

An extension layer 51 is formed on the entire surface of the support layer 5 on which the second pattern structures 11 and the contact patterns 17 are formed. The extension layer 51 may be formed on two sidewalls and surfaces of each of the second pattern structures 11 and surfaces of the contact patterns 17. The extension layer 51 may be formed of an insulating layer such as a nitride layer.

The extension layer 51 deteriorates step coverage, thereby preventing a uniform thickness thereof along the surfaces of the second pattern structures 11. The extension layer 51 may have an upper width or thickness 20a in the upper region 41 of the second pattern structures 11 that is greater than a middle width or thickness 20b in the intermediate region 43. The middle width or thickness 20b of the extension layer 51 in the intermediate region 43 of the second pattern structures 11 may be greater than a lower width or thickness 20c in the lower region 45.

The extension layer 51 may have an inverse U-shape, and an upper width or thickness thereof may be relatively large, and a lower width or thickness thereof may be relatively small. The extension layer 51 may be formed to cover an upper shape of the second pattern structures 11. Due to the extension layer 51, upper surface areas of the second pattern structures 11 and the extension layer 51 may be increased.

The extension layer 51 may be formed using various methods. According to some embodiments of the inventive concept, the extension layer 51 may be formed by using a physical vapor deposition (PVD) method which provides poor step coverage. According to some embodiments of the inventive concept, the extension layer 51 may be formed using a cyclic chemical vapor deposition (CVD) method so as to obtain poor step coverage. The cyclic CVD method is a thin layer deposition method performed by combining an atomic layer deposition (ALD) method and a CVD method. Like the ALD method, in the cyclic CVD method, reactant products are periodically supplied and discharged but are not completely discharged, and reactions between the reactant products occur to increase a deposition speed to thereby adjust step coverage.

Figure 5:
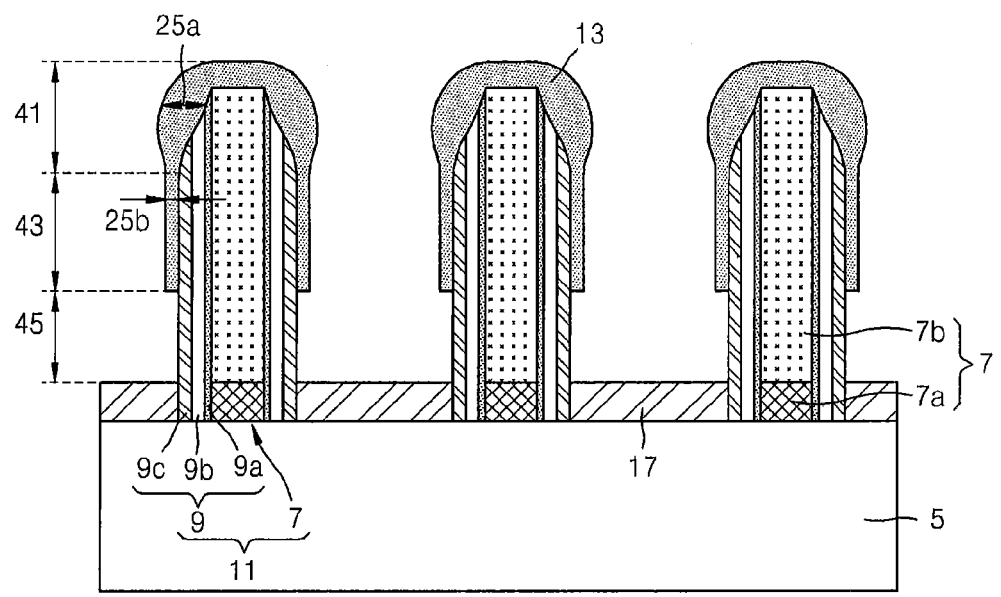

Referring to FIG. 5, the extension patterns 13 are formed by etching the extension layer 51. In contrast to FIG. 2, the extension patterns 13 may also be formed on surfaces of the second pattern structures 11. According to some embodiments of the inventive concept, when etching the extension layer 51, the extension patterns 13 may be formed in conformity with the surfaces of the second pattern structures 11 as illustrated in FIG. 2.

By forming the extension patterns 13 on two sides of each of the second pattern structures 11, the upper surfaces and areas of the second pattern structures 11 and the extension patterns 13 may be increased. According to some embodiments of the inventive concept, an upper portion of the extension layer 51 is further etched, and as illustrated in FIG. 2, vertical sidewall inclination profiles of the second pattern structures 11 and the extension patterns 13 may be formed.

The extension patterns 13 are formed at a height equal to the surfaces of the second pattern structures 11 so that the upper width 25a of the extension patterns 13 may be greater than the middle width 25b thereof due to step coverage of the extension layer 51. The extension patterns 13 may not be formed in the lower region 45 of the second pattern structures 11, such that lower regions/portions 145 of the opposing sidewalls of the second pattern structures 11 may be free of the extension patterns 13. Due to the etching of the extension layer 51, the extension patterns 13 are not formed on the contact patterns 17 and are spaced apart therefrom.

Figure 6:
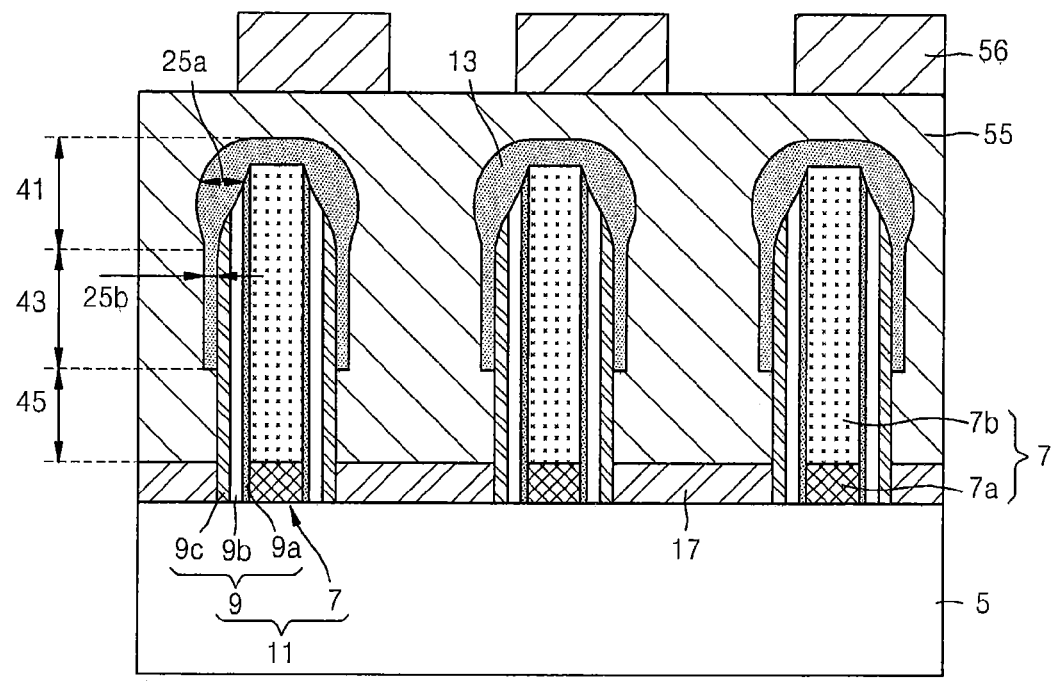

Referring to FIG. 6, a conductive material layer 55 is formed to fill spaces between the second pattern structures 11 and the extension patterns 13. According to some embodiments of the inventive concept, the conductive material layer 55 may be formed as a barrier layer, for example, of a complex layer including a Ti/TiN layer and a tungsten layer. A photoresist pattern 56 is formed on the conductive material layer 55 by using a photolithography method. The photoresist pattern 56 may be formed in a portion corresponding to a layout of the conductive patterns 19 of FIG. 1 described above.

Figure 7:
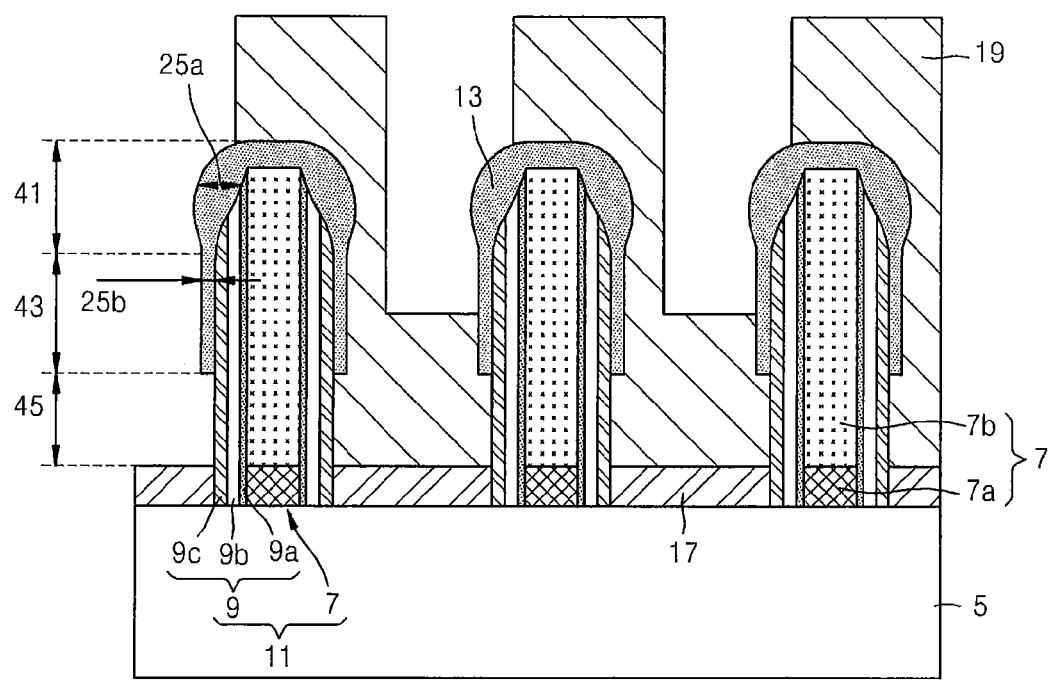

Referring to FIG. 7, the photoresist pattern 56 is used as an etching mask to etch the conductive material layer 55, thereby forming the conductive patterns 19. An etching depth of the conductive material layer 55 may be adjusted in various ways. For example, the conductive material layer 55 may be etched relatively deeply so that the conductive patterns 19 are relatively close to the contact patterns 17.

In the above-described operation, the upper surface areas of the second pattern structures 11 and the extension patterns 13 are increased, and the vertical sidewall inclination profiles of the second pattern structures 11 and the extension patterns 13 are formed. Accordingly, when forming the conductive patterns 19 using a photolithography method, a misalignment margin between the second pattern structures 11 and the conductive patterns 19 may be increased, and formation of bridges between the conductive patterns 19 may be reduced or prevented.

Also, as described above, due to the extension patterns 13 having the upper width or thickness 25a greater than the middle width or thickness 25b, an open surface area of the contact patterns 17 located between the second pattern structures 11 and the extension patterns 13 may be increased. By increasing the open surface area of the contact patterns 17, contact resistance of the conductive patterns 19 may be reduced.

FIGS. 8 through 11 are cross-sectional views illustrating a method of fabricating a semiconductor device according to other embodiments of the inventive concept. FIGS. 8 through 11 may be cross-sectional views of the semiconductor device of FIG. 1 taken along a line II-II, and like reference numerals as in FIGS. 1 through 3 or FIGS. 4 through 7 denote like elements. The method illustrated in FIGS. 8 through 11 is similar to the method illustrated in FIGS. 4 through 7 except that a second extension layer 52 is formed on the extension layer 51 and extension patterns 13a are also formed in the lower region 45 of the second pattern structures 11.

Figure 8:
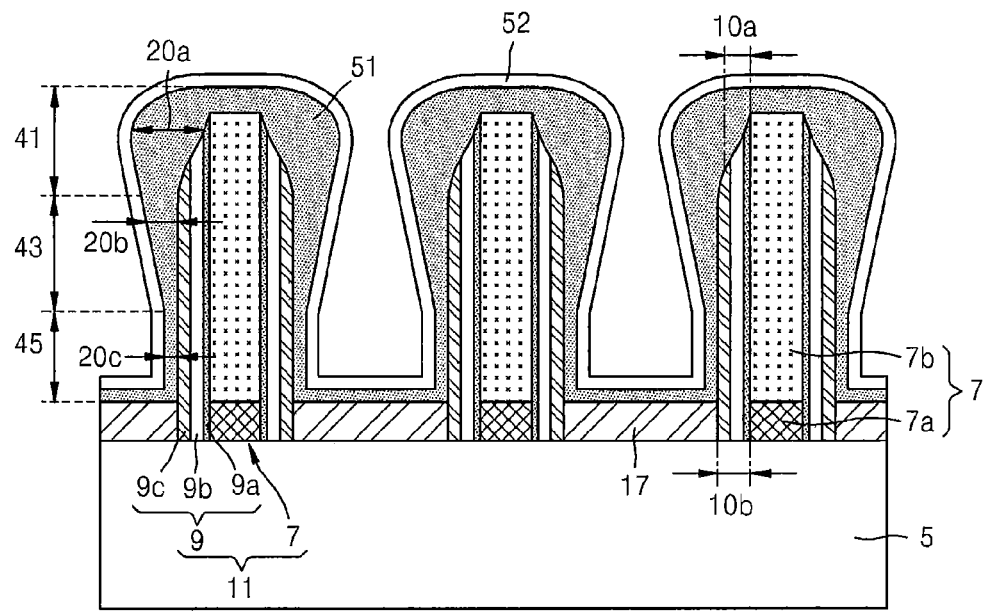
FIGS. 8 through 11 are cross-sectional views illustrating a method of fabricating a semiconductor device according to other embodiments of the inventive concept.

Referring to FIG. 8, the second pattern structures 11 are formed on the support layer 5. The second pattern structures 11 may include body patterns 7 and spacers 9. The spacers 9 may have an upper width or thickness 10a that is smaller or narrower than a lower width or thickness 10b. The upper width 10a of the spacers 9 may be reduced as the spacers 9 are etched in a semiconductor manufacturing process. Contact patterns 17 are formed between the second pattern structures 11 on the support layer 5.

The extension layer 51 is formed on the entire surface of the support layer 5 on which the second pattern structures 11 and the contact patterns 17 are formed. The extension layer 51 may be formed on two sidewalls and surfaces of each of the second pattern structures 11 and surfaces of the contact patterns 17. The extension layer 51 may be formed of an insulating layer such as a nitride layer.

The extension layer 51 deteriorates step coverage, thereby preventing a uniform thickness thereof along the surfaces of the second pattern structures 11. As described above, the extension layer 51 may have the upper width or thickness 20a that is greater than the middle width or thickness 20b or the lower width or thickness 20c. The method of forming the extension layer 51 is as described above.

The second extension layer 52 is formed on the extension layer 51. The second extension layer 52 may be formed uniformly along a surface of the extension layer 51. The second extension layer 52 may be formed to increase a thickness of the upper region 41 of the second pattern structures 11 and to protect the lower region 45 of the second pattern structures 11. The second extension layer 52 may be formed from the same layer as the extension layer 51. The second extension layer 52 may be formed of an insulating layer such as a nitride layer.

The extension layer 51 and the second extension layer 52 may have an upper width or thickness in the upper region 41 of the second pattern structures 11 that is greater than a middle width or thickness in the intermediate region 43. The extension layer 51 and the second extension layer 52 may have the middle width or thickness in the intermediate region 43 of the second pattern structures 11 that is greater than a lower width or thickness in the lower region 45.

Figure 9:
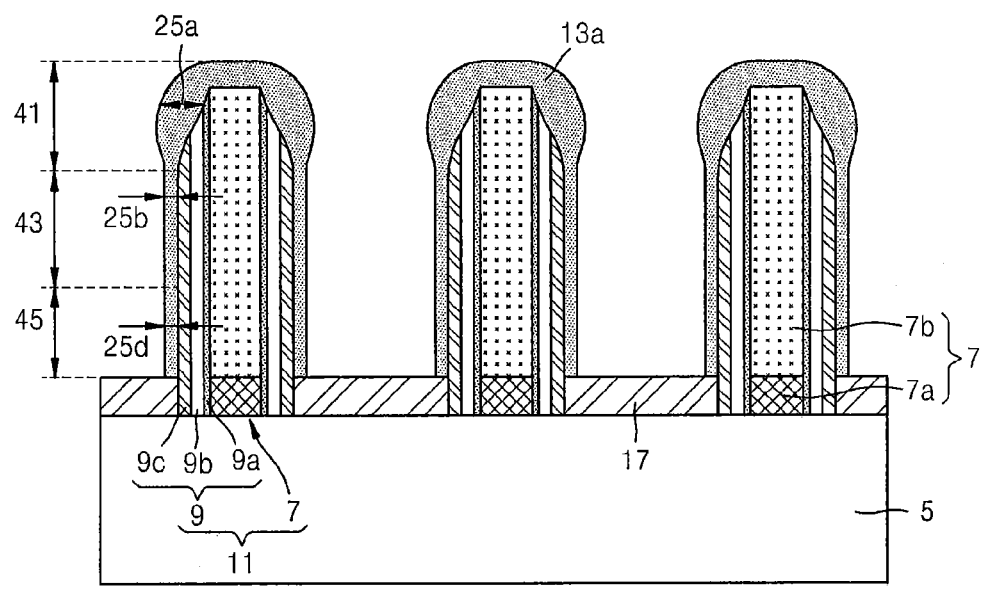

Referring to FIG. 9, extension patterns 13a are formed by etching the extension layer 51 and the second extension layer 52. According to some embodiments of the inventive concept, when etching the extension layer 51 and the second extension layer 52, the extension patterns 13a may be formed on the surfaces of the second pattern structures 11. According to some embodiments of the inventive concept, when etching the extension layer 51 and the second extension layer 52, the extension patterns 13a may be formed in conformity with the surfaces of the second pattern structures 11 as illustrated in FIG. 2.

According to the current embodiment of the inventive concept, in contrast to FIG. 2, the extension patterns 13a may also be formed in a lower region of the second pattern structures 11. The extension patterns 13a may be formed in all of the upper region 41, the middle region 43, and the lower region 45 of the second pattern structures 11.

By forming the extension patterns 13a on two sides of each of the second pattern structures 11, the upper surface areas of the second pattern structures 11 and the extension patterns 13a may be increased. According to some embodiments of the inventive concept, upper portions of the extension layer 51 and the second extension layer 52 may be further etched to form vertical sidewall inclination profiles of the second pattern structures 11 and the extension patterns 13a.

The extension patterns 13a may be formed at a height equal to the surfaces of the second pattern structures 11 and may have the upper width 25a that is greater than the middle width 25b or a lower width 25d. Due to the second extension layer 52, the extension patterns 13a may also be formed in the lower region 45 of the second pattern structures 11.

Figure 10:
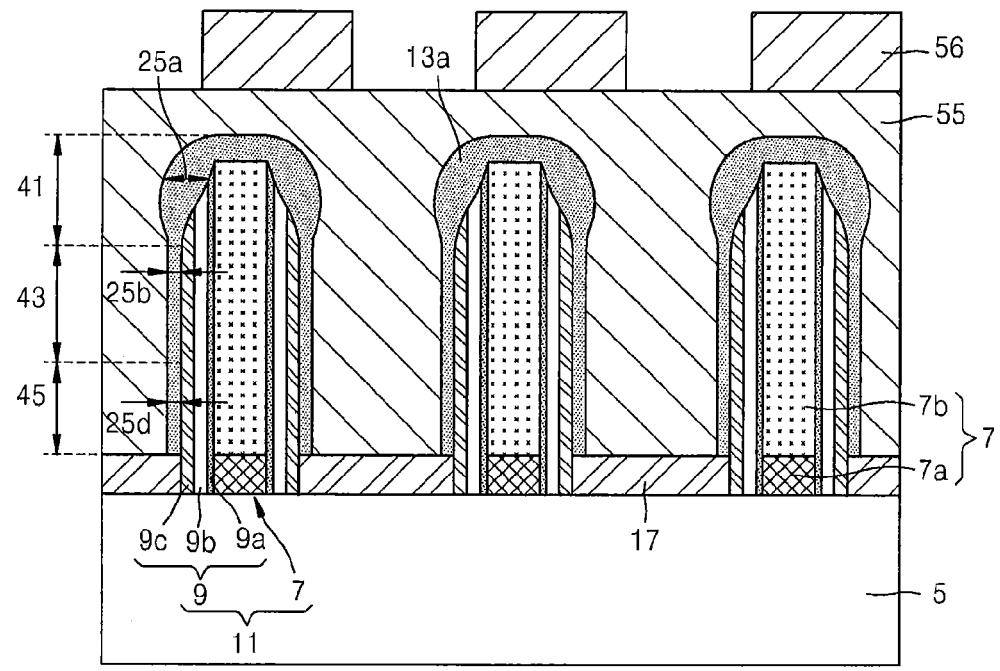

Referring to FIG. 10, as described above with reference to FIG. 6, a conductive material layer 55 is formed to fill spaces between the second pattern structures 11 and the extension patterns 13a. A photoresist pattern 56 is formed on the conductive material layer 55 by using a photolithography method. The photoresist pattern 56 may correspond to a layout of the conductive patterns 19 described above.

Figure 11:
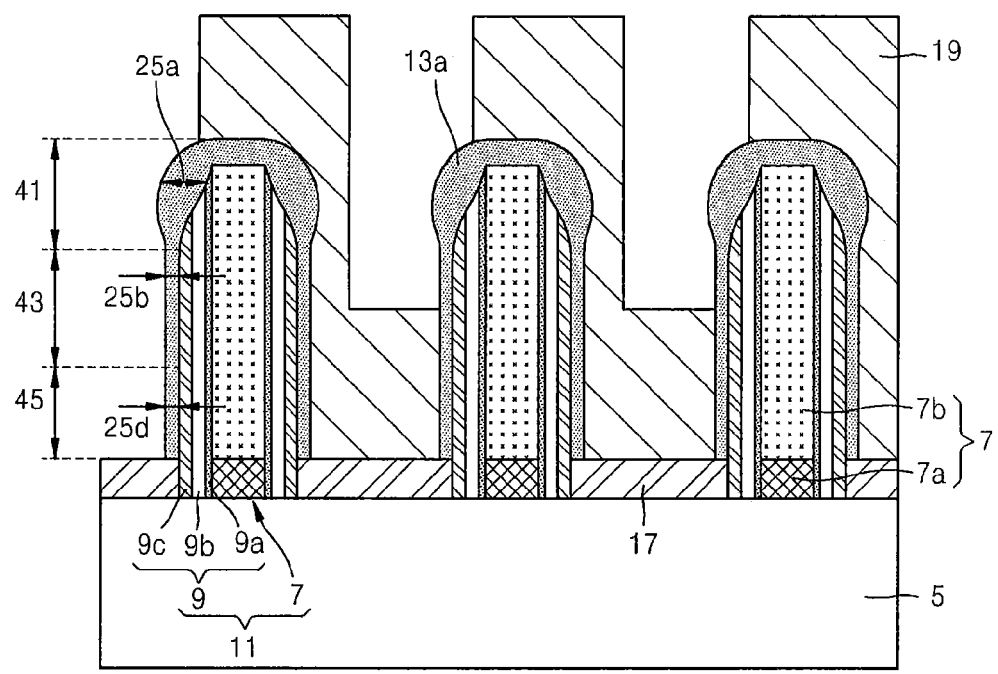

Referring to FIG. 11, as described above with reference to FIG. 7 above, the photoresist pattern 56 may be used as an etching mask to etch the conductive material layer 55 to form conductive patterns 19. The upper surface areas of the second pattern structures 11 and the extension patterns 13a are increased, and vertical sidewall inclination profiles of the second pattern structures 11 and the extension patterns 13a are formed. Accordingly, when forming the conductive patterns 19 using a photolithography method, a misalignment margin between the second pattern structures 11 and the conductive patterns 19 may be increased, and formation of bridges between the conductive patterns 19 may be reduced or prevented.

Also, as described above, due to the extension patterns 13a, an open surface area of the contact patterns 17 located between the second pattern structures 11 and the extension patterns 13a may be increased. By increasing the open surface of the contact patterns 17, contact resistance of the contact patterns 19 may be reduced.

Figure 12:
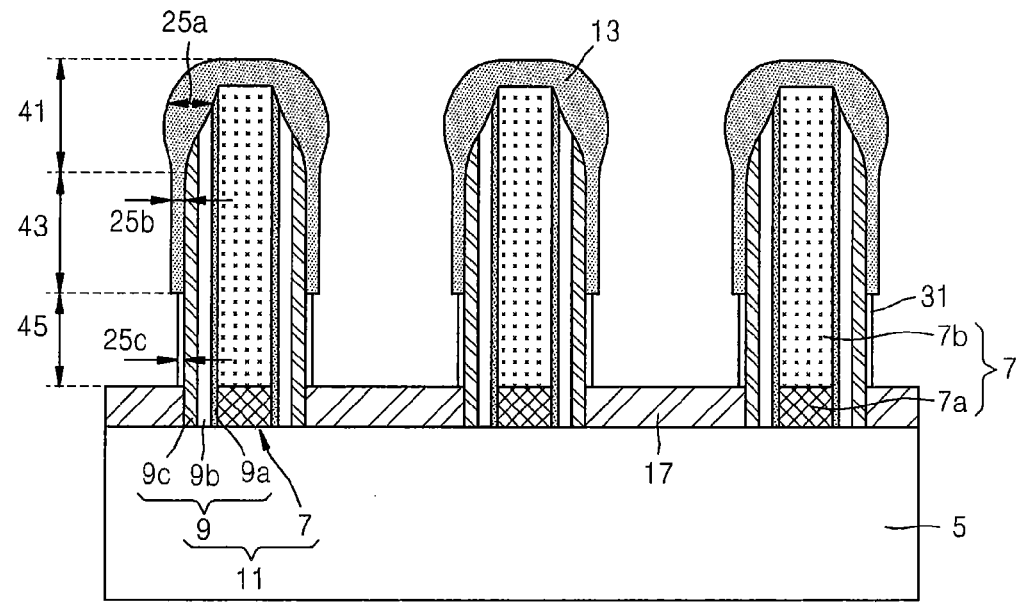
FIGS. 12 through 14 are cross-sectional views illustrating a method of fabricating a semiconductor device according to other embodiments of the inventive concept.
Figure 13:
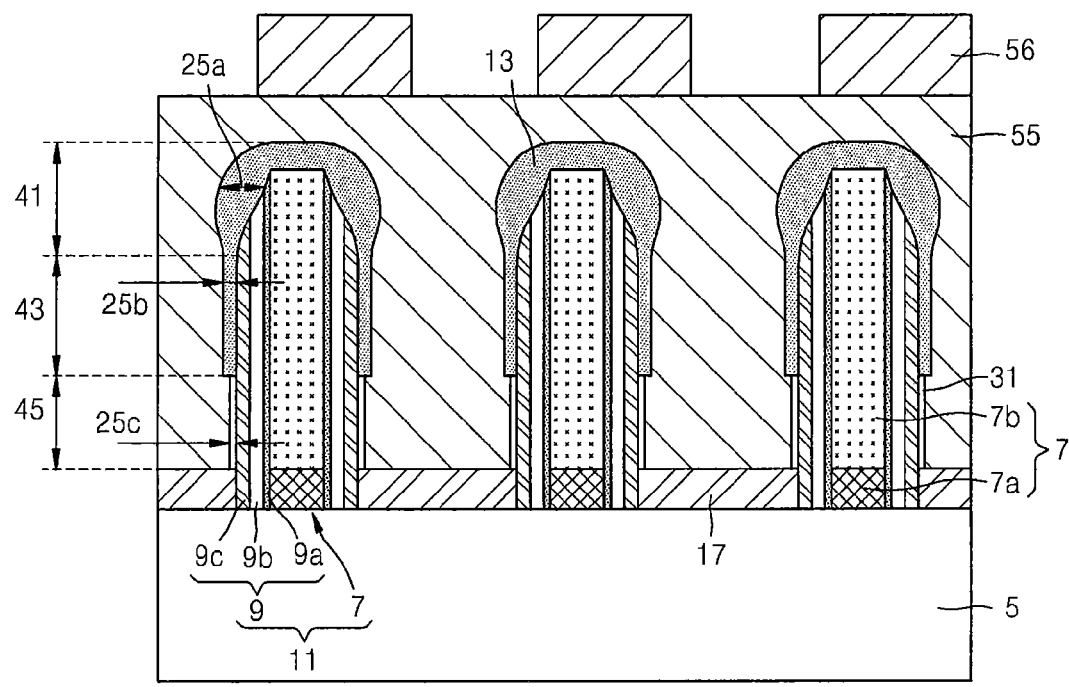
Figure 14:
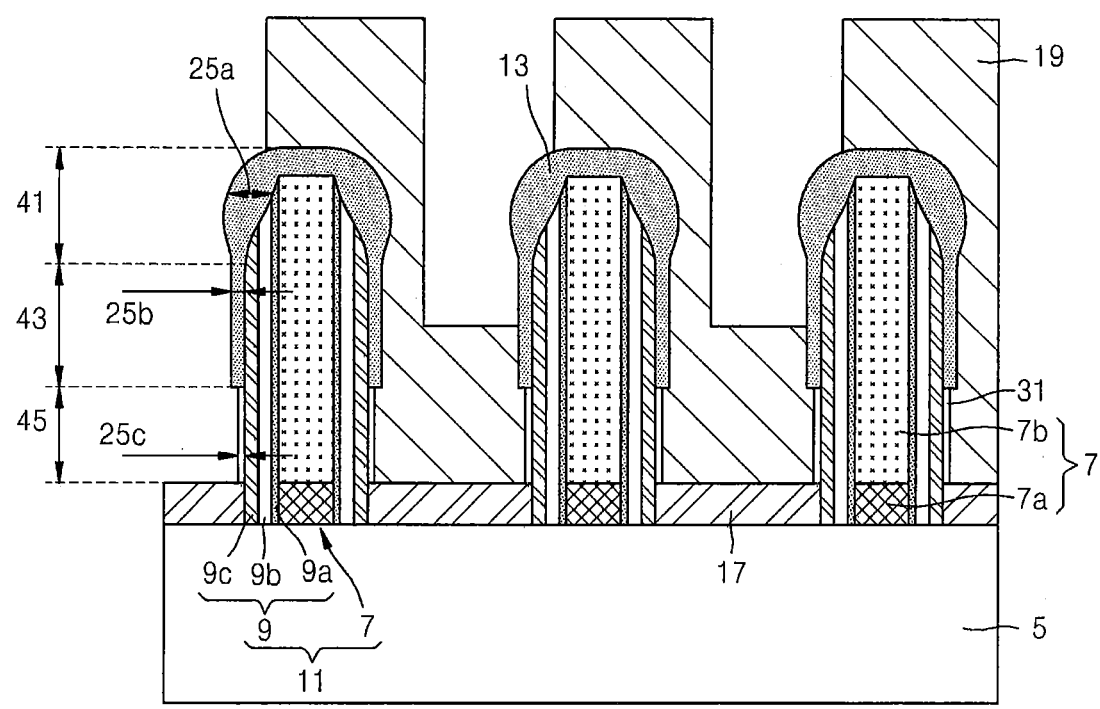

FIGS. 12 through 14 are cross-sectional views illustrating a method of fabricating a semiconductor device according to other embodiments of the inventive concept. FIGS. 12 through 14 may be cross-sectional views of the semiconductor device of FIG. 1 taken along a line II-II, and like reference numerals as in FIGS. 1 through 3 denote like elements. The method illustrated in FIGS. 12 through 14 is similar to the method illustrated in FIGS. 4 through 7 except that reinforcement extension patterns 31 are formed in the lower region 45 of the second pattern structures 11.

Referring to FIG. 12, as described above with reference to FIGS. 4 and 5, the second pattern structures 11 and the extension patterns 13 are formed on the support layer 5. The second pattern structures 11 may include body patterns 7 and spacers 9. The spacers 9 may have the upper width or thickness 10$a$ that is smaller or narrower than the lower width or thickness 10$b$. The upper width 10$a$ of the spacers 9 may be reduced as the spacers 9 are etched in a semiconductor manufacturing process. The contact patterns 17 are formed between the second pattern structures 11 on the support layer 5.

The extension patterns 13 may be formed on two sidewalls and surfaces of each of the second pattern structures 11 and surfaces of the contact patterns 17. The extension patterns 13 may be formed in the upper region 41 and the intermediate region 43 of the second pattern structures 11.

Next, the reinforcement extension patterns 31 are formed in the lower region 45 of the second pattern structures 11. The reinforcement extension patterns 31 are formed to reinforce the lower region 45 of the second pattern structures 11. The width 25$c$ of the reinforcement extension patterns 31 may be equal to or smaller than the middle width 25$b$ of the extension patterns 13 as has been described above with reference to FIG. 3. Referring to FIG. 12, the width 25$c$ of the reinforcement extension patterns 31 indicates that it is smaller or narrower than the middle width 25$b$ of the extension patterns 13.

As described above, by forming extension patterns on two sides of the second pattern structures 11, the upper surfaces of the second pattern structures 11 and the extension patterns 13 may be increased. As the extension patterns 13 are formed at a height equal to surfaces of the second pattern structures 11, the upper width 25$a$ may be greater than the middle width 25$b$ or the lower width 25$c$.

Referring to FIG. 13, as described above, a conductive material layer 55 is formed on the support layer 5 to fill space between the second pattern structures 11 and the extension patterns 13. A photoresist pattern 56 is formed on the conductive material layer 55 by using a photolithography method. The photoresist pattern 56 may correspond to a layout of the conductive patterns 19 of FIG. 1.

Referring to FIG. 14, the photoresist pattern 56 is used as an etching mask to etch the conductive material layer 55 to form the conductive patterns 19. As described above, the upper surface areas of the second pattern structures 11 and the extension patterns 13 are increased, and the vertical sidewall inclination profiles of the second pattern structures 11 and the extension patterns 13 are formed. Accordingly, when forming the conductive patterns 19 by using a photolithography method, a misalignment margin between the second pattern structures 11 and the conductive patterns 19 may be increased, and formation of bridges between the conductive patterns 19 may be reduced or prevented.

Also, as described above, due to the extension patterns 13 having the upper width or thickness 25$a$ greater than the middle width or thickness 25$b$, an open surface area of the contact patterns 17 located between the second pattern structures 11 and the extension patterns 13 may be increased. By increasing the open surface area of the contact patterns 17, contact resistance of the conductive patterns 19 may be reduced.

Hereinafter, a memory device to which the semiconductor device according to the embodiments of the inventive concept of FIGS. 1 through 14 and the method of fabricating the semiconductor device are applied will be described.

Figure 15:
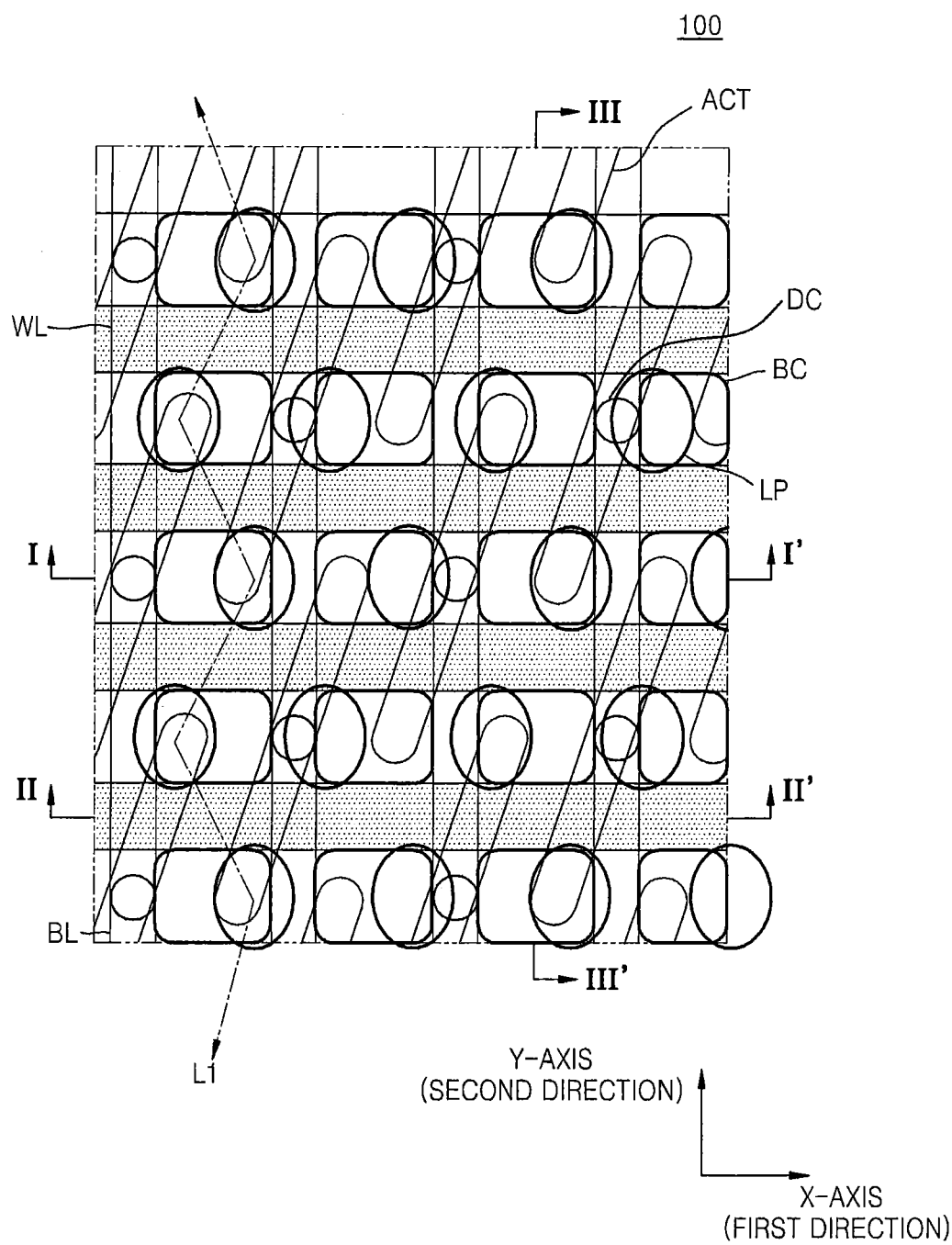
FIG. 15 is a schematic layout diagram illustrating a semiconductor device according to some embodiments of the inventive concept.

FIG. 15 is a schematic layout diagram illustrating a semiconductor device 100 according to some embodiments of the inventive concept.

In detail, the semiconductor device 100 may include a plurality of active regions ACT. The active regions ACT may also be defined by a device isolation layer 114 (see FIG. 16A) formed on a substrate 110 (see FIG. 16A). As the design rule for semiconductor devices is decreasing, the active regions ACT may be arranged in the form of diagonally- or obliquely-extending bars.

A plurality of word lines (or gate lines) WL that extend parallel to each other in the first direction (X-axis direction) may be arranged on the active regions ACT and across the active regions ACT. The word lines WL may be arranged at equidistant intervals. The widths of the word lines WL or the intervals between the word lines WL may be determined according to the design rules. The word lines WL may be the first pattern structures 11 of FIG. 1.

A plurality of bit lines BL that are orthogonal to the word lines WL and extend parallel in the second direction (Y-axis direction) may be arranged on the word lines WL. The bit lines BL may also be arranged at equidistant intervals. The bit lines BL may be the second pattern structures 11 of FIG. 1. The widths of the bit lines BL or the intervals between the word lines BL may be determined according to the design rules.

According to embodiments of the inventive concept, the bit lines BL may be arranged parallel to each other at pitches of 3F. Also, the word lines WL may be arranged parallel to each other at pitches of 2F. F may indicate a minimum lithographic feature size. When the bit lines BL and the word lines WL are arranged at the above-described pitches, a semiconductor device may include a memory cell having a unit cell size of 6F$^2$.

The semiconductor device 100 according to the current embodiment of the inventive concept may include various contact arrangements formed on the active regions ACT such as direct contacts DC, buried contacts BC, or landing pads LP. The direct contacts DC may refer to contacts that connect the active regions ACT to bit lines, and the buried contacts BC may refer to contacts that connect the active regions ACT to a bottom electrode of a capacitor. The buried contacts BC may correspond to the contact patterns 17 of FIG. 1. The landing pads LP may correspond to the conductive patterns 19 of FIG. 1.

A contact surface area between the buried contacts BC and the active regions ACT may typically be small due to the arrangement structure. Accordingly, while increasing a contact surface area with respect to the active regions ACT, conductive landing pads LP may be introduced to increase a contact surface area with respect to a bottom electrode of a capacitor. The landing pads LP may be arranged between the active regions ACT and the buried contacts BC, or between the buried contacts BC and the bottom electrode of the capacitor. By increasing the contact surface area by introducing the landing pads LP, contact resistance between the active regions ACT and the bottom electrode of the capacitor may be reduced.

In the semiconductor device 100 of the current embodiment of the inventive concept, the direct contacts DC may be arranged in a center portion of the active regions ACT, and the buried contacts BC may be arranged at two ends of the active regions ACT. As the buried contacts BC are arranged at two ends of the active regions ACT, the landing pads LP may be arranged adjacent to the two ends of the active regions ACT to be partially overlapped with the buried contacts BC.

The word lines WL are buried in a substrate of the semiconductor device 100, and may be arranged across the active regions ACT between the direct contacts DC or between the buried contacts BC. As illustrated in FIG. 15, two word lines WL are arranged across one active region ACT, and as the active region ACT is diagonally arranged, the active region ACT may be at a predetermined angle less than 90° with respect to the word lines WL.

The direct contacts DC and the buried contacts BC may be symmetrically arranged, and thus, may be arranged along a straight line along the X-axis and the Y-axis. The landing pads LP may be arranged in a zigzag pattern L1 in or with respect to the second direction (Y-axis direction) along which the bit lines BL extend, unlike the direct contacts DC and the buried contacts BC. In addition, the landing pads LP may be arranged to overlap with the same side portion of each bit line BL in the first direction (X-axis direction) along which the word lines WL extend. For example, each landing pad LP of a first line may overlap with a left side of a corresponding bit line BL, and each landing pad LP of a second line may overlap with a right side of a corresponding bit line BL.

FIGS. 16 through 19 are cross-sectional views illustrating the semiconductor device 100 of FIG. 15 and a method of fabricating the semiconductor device 100, according to some embodiments of the inventive concept. FIGS. 16A, 17A, 18A, and 19A are cross-sectional views taken along a line I-I' of FIG. 1, and FIGS. 16B, 17B, 18B, and 19B are cross-sectional views taken along a line II-II' of FIG. 1, and FIGS. 16C, 17C, 18C, and 19C are cross-sectional views taken along a line III-III' of FIG. 15.

Figure 16A:
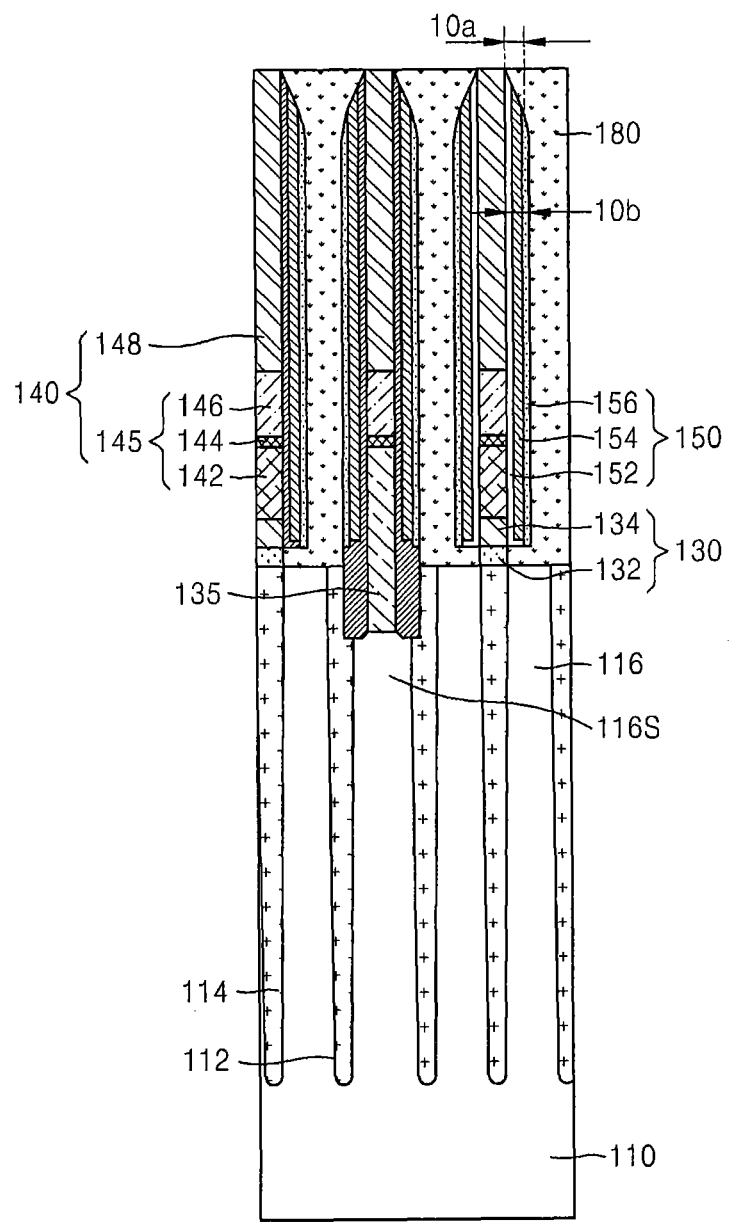
FIGS. 16A, 16B, 16C, 17A, 17B, 17C, 18A, 18B, 18C, 19A, 19B, and 19C are cross-sectional views illustrating the semiconductor device of FIG. 15 and a method of fabricating the semiconductor device of FIG. 15, according to some embodiments of the inventive concept.

Referring to FIG. 16A, a device isolation trench 112 is formed in the substrate 110, and a device isolation layer 114 is formed in the device isolation trench 112. An active region 116 may be defined in the substrate 110 by the device isolation layer 114. The active region 116 may be in the form of an island having a short axis and a long axis as illustrated in FIG. 15, and may be diagonally arranged to have an angle of less than 90° with respect to the word lines WL 124 formed on the active region 116.

The substrate 110 may include silicon (Si) such as crystalline Si, polycrystalline Si, or amorphous Si. According to embodiments of the inventive concept, the substrate 110 may include a compound semiconductor such as germanium (Ge), or SiGe, silicon carbide (SIC), gallium arsenide (GaAs), indium arsenide (InAs), or indium phosphide (InP). According to embodiments of the inventive concept, the substrate 110 may include a conductive area such as an impurity-doped well or an impurity-doped structure.

Figure 16B:
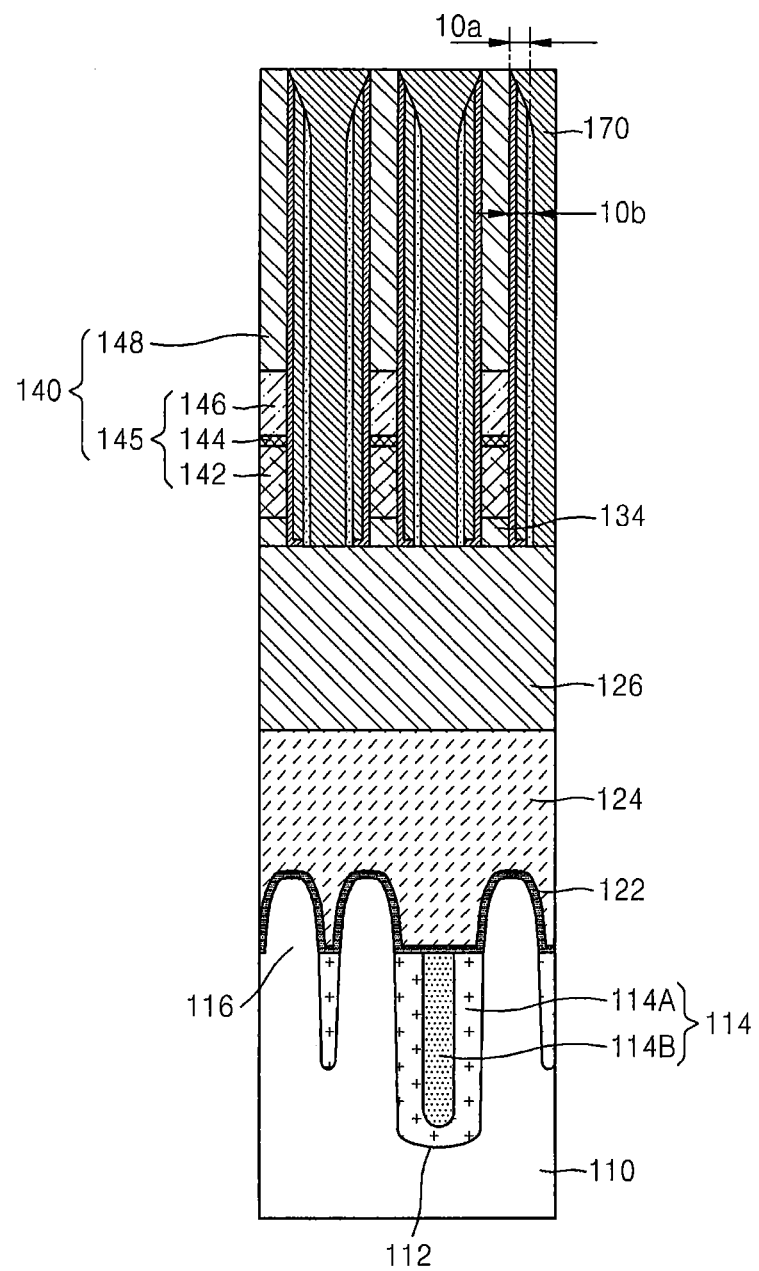
Figure 16C:
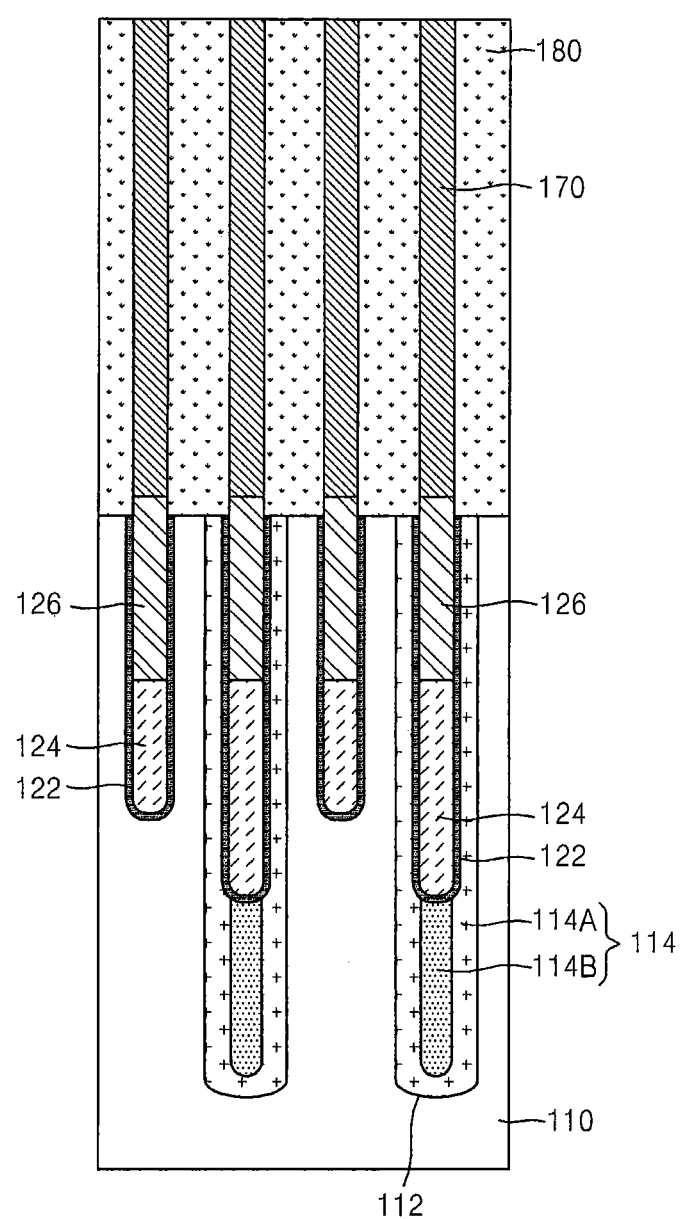

The device isolation layer 114 may be formed of a single insulating layer or may include, as illustrated in FIG. 16B or 16C, an outer insulation layer 114A and an inner insulation layer 114B. The outer insulation layer 114A and the inner insulation layer 114B may be formed of different materials. For example, the outer insulation layer 114A may be formed of an oxide layer, and the inner insulation layer 114B may be formed of a nitride layer. However, the structure of the device isolation layer 114 is not limited thereto. For example, the device isolation layer 114 may be formed of multiple layers formed of a combination including at least three types of insulating layers.

As illustrated in FIG. 16B, a gate dielectric layer 122, a word line 124, and a buried insulation layer 126 are sequentially formed on the substrate 110. According to embodiments of the inventive concept, after forming the word line 124, the word line 124 is used as a mask to implant impurity ions into portions of the substrate 110 on two sides of the word line 124, thereby forming a source/drain region on the active region 116. A source region 116S is labeled in FIG. 16A. The direct contacts DC may be connected to the source region 116S. According to other embodiments of the inventive concept, an impurity ion implantation process for forming source and drain regions may be performed before forming the word line 124.

An upper surface of the word line 124 may be lower than an upper surface of the substrate 110. A lower surface of the word line 124 may have an uneven form as illustrated in FIG. 16B, and a saddle fin type transistor (saddle FINFET) may be formed in the active region 116. According to embodiments of the inventive concept, the word line 124 may be formed of Ti, TiN, Ta, TaN, W, WN, TISiN, and/or WSiN.

The gate dielectric layer 122 may be formed of at least one material selected from high-k dielectric films that have a higher dielectric constant than a silicon oxide layer, a silicon nitride layer, a silicon oxynitride layer, oxide/nitride/oxide (ONO), or a silicon oxide layer. For example, the gate dielectric layer 122 may have a dielectric constant of about 10 to about 25.

According to embodiments of the inventive concept, the gate dielectric layer 122 may be formed of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and/or lead scandium tantalum oxide (PbScTaO). Also, the gate dielectric layer 122 may be formed of $HfO_2$, $Al_2O_3$, $HfAlO_3$, $Ta_2O_3$, or $TiO_2$.

An upper surface of the buried insulation layer 126 may be approximately at the same level as the upper surface of the substrate 110. The buried insulation layer 126 may be formed of a silicon oxide layer, a silicon nitride layer, a silicon oxynitride layer, or a combination thereof.

A silicon oxide layer 132 and a silicon nitride layer 134 may be formed on the substrate 110. The silicon nitride layer 134 may form an interlayer insulation layer pattern 130 with the silicon oxide layer 132. The interlayer insulation layer pattern 130 may have a thickness of about 200 Å to about 400 Å. The interlayer insulation layer pattern 130 may be formed of a single layer of a silicon oxide. For example, the interlayer insulation layer pattern 130 may be formed of tetraethylorthosilicate (TEOS), high density plasma (HDP), or boro-phospho silicate glass (BPSG).

A direct contact 135 that is electrically connected to the source region 116S among the active region 116 is formed. Spacers that are formed of a different material from the device isolation layer 114 may be formed on two sidewalls of the direct contact 135. For example, when the device isolation layer 114 is formed of a silicon oxide, the spacer may be formed of a silicon nitride layer.

Then, a plurality of bit line structures 140 extending parallel to each other are formed on the interlayer insulation layer pattern 130 and the direct contact 135 in the second direction (Y-axis direction of FIG. 15). The bit line structures 140 may be included in the second pattern structures 11 of FIGS. 1 through 14. The bit line structures 140 may be body patterns 7 included in the second pattern structures 11 of FIGS. 2 and 3. The bit line structures 140 may each include a bit line 145 and an insulating capping line 148 covering an upper surface of the bit line 145. The bit line 145 may be electrically connected to the direct contact 135.

According to embodiments of the inventive concept, the bit line 145 may be formed of an impurity-doped semiconductor, a metal, a metal nitride, and/or a metal silicide. The bit line 145 may be a single layer or may be a multi-layer as illustrated in FIG. 16B or 16C. For example, the bit line 145 may have a stack structure in which a doped polysilicon 142, a tungsten nitride 144, and tungsten 146 are sequentially stacked. According to embodiments of the inventive concept, the insulation capping line 148 may be formed of a silicon nitride layer. The insulation capping line 148 may be thicker than the bit line 145.

According to embodiments of the inventive concept, in order to form the bit line structures 140, first, a conductive layer for forming a bit line is formed on the interlayer insulation layer pattern 130, and an insulation layer covering the conductive layer is formed. After forming the insulation capping line 148 by patterning the insulation layer, the insulation capping line 148 is used as an etching mask to etch the conductive layer for forming a bit line, thereby forming a bit line 145.

According to embodiments of the inventive concept, the conductive layer for forming a bit line may be formed of a multi-layer. For example, the conductive layer for forming a bit line may have a multi-layer structure in which a first metal silicide layer, a conductive barrier layer, a second metal silicide layer, and a metal or a metal nitride layer are sequentially stacked. In the semiconductor device according to the current embodiment of the inventive concept, the conductive layer for forming a bit line may include a doped polysilicon layer, a tungsten nitride layer, and a tungsten layer.

A first spacer 152 is formed on a sidewall of the bit line 145. The first spacer 152 may be used as a protection layer to protect the bit line structures 140. According to embodiments of the inventive concept, the first spacer 152 may be formed of a silicon nitride layer. For example, the first spacer 152 may have a thickness of about 30 Å to about 80 Å.

Furthermore, a second spacer insulation layer is deposited on a resultant product including the first spacer 152, and then the first spacer 152 is used as an etching stopper layer to etch-back an insulation layer for a second spacer, thereby forming a plurality of second spacers 154 on two sidewalls of each of the bit line structures 140. According to embodiments of the inventive concept, the second spacer 154 may be formed of a silicon oxide or silicon germanium (SiGe) compounds, or a polymer. However, the material of the second spacers 154 is not limited to the above-described materials.

The second spacers 154 may be formed of a material having an etching selectivity with respect to the first spacer 152. For example, the second spacers 154 may be formed of an insulation material or a conductive material. According to the semiconductor device of the current embodiment of the inventive concept, the second spacers 154 may be formed of a silicon oxide. As illustrated in FIG. 16A, upper and lateral surfaces of the first spacer 152 and the second spacers 154 may be removed during an etch-back operation.

An insulation layer for forming a third spacer may be formed on a resultant product including the second spacers 154. After forming the insulation layer for a third spacer, the second spacers 154 are used as an etching stopper layer to etch-back the insulation layer for a third spacer, thereby forming a plurality of third spacers 156 covering the second spacer 154 on two sidewalls of each of the bit line structures 140.

The third spacers 156 may be formed of a different material from the second spacers 154. According to embodiments of the inventive concept, the third spacers 156 may be formed of a silicon oxide layer, a silicon nitride layer, or a silicon oxynitride layer. In the semiconductor device of the current embodiment of the inventive concept, the third spacers 156 may be formed of a silicon nitride layer. The third spacers 156 may have a thickness of about 20 Å to about 100 Å.

As illustrated in FIG. 16A, upper and lateral portions of the first spacer 152, the second spacers 154, and the third spacers 156 may be removed during an etch-back process. The first spacer 152, the second spacers 154, and the third spacers 156 may form a multi-layer spacer 150 that surrounds sidewalls of the bit line structures 140. The multi-layer spacer 150 may correspond to the spacers 9 included in the second pattern structures 11 in FIGS. 2 and 3. As described above, the multi-layer spacer 150 may have the upper width or thickness 10a that is smaller or narrower than the lower width or thickness 10b therebelow during a manufacturing process thereof.

After forming the third spacers 156 by performing an etch-back process, the interlayer insulation layer pattern 130 may be exposed. For example, as material layers of the first spacer 152, the second spacer 154, and the third spacer 156 are removed by performing the etch-back process, the silicon oxide layer 132 in the lower portion may be exposed. Furthermore, by using the third spacer 156 as an etching stopper layer, the silicon oxide layer 132 in the lower portion may be etched to expose a portion of the upper surface of the active region 116. When the upper surface of the active region 116 is exposed, a portion of an upper surface of the device isolation layer 114 adjacent to the active region 116 may also be exposed.

As described above, according to the methods of fabricating a semiconductor device, the active region 116 may be opened when forming the multi-layer spacer 150 of the bit line structures 140. Accordingly, the active region 116 may be opened in a line form.

Furthermore, after opening the upper surface of the active region 116, an oxide layer, for example, a silicon oxide layer 132 is further etched by wet etching, thereby extending an open surface area of the upper surface of the active region 116. As the open surface area of the upper surface of the active region 116 is extended, a contact surface area between the buried contacts BC and the active region 116 may be extended later. Accordingly, contact resistance between the buried contacts BC and the active region 116 may be reduced. According to or depending on circumstances, the wet etching process according to the current embodiment of the inventive concept may be omitted.

A first insulation layer 170 having a contact hole that exposes upper surfaces of the substrate 110 and the buried insulation layer 126 is formed on the buried insulation layer 126 and the substrate 110. As illustrated in FIG. 16A, the upper surface of the substrate 110 corresponding to a buried contact may be exposed, and as illustrated in FIG. 16C, an upper surface of a portion of the buried insulation layer 126 corresponding to the word line 124 may be exposed as illustrated in FIG. 16C. The first insulation layer 170 may be, for example, an insulation layer formed of an oxide. The first insulation layer 170 may be a fence that surrounds two sides of the buried contacts BC.

Next, a conductive material layer is formed in the contact hole that exposes the upper surfaces of the substrate 110 and the buried insulation layer 126, and then buried contacts BC 180 are formed by using a chemical mechanical polishing (CMP) process. That is, a conductive material layer is formed between the bit line structures 140 and the multi-layer spacer 150. Then, an upper portion of the conductive material layer is removed such that the upper surfaces of the bit line structures 140 and the multi-layer spacer 150 are exposed, thereby forming a plurality of buried contacts 180. The buried contacts BC may correspond to the contact patterns 17 of FIGS. 1 through 14 as described above.

According to the methods of fabricating a semiconductor device of the current embodiment of the inventive concept, the buried contacts 180 may be formed of polysilicon, which may be doped with impurities. According to or depending on circumstances, the buried contacts 180 may be formed of a metal, a metal silicide, a metal nitride, or a combination of these. The buried contacts 180 may include a barrier layer between the bit line structures 140 and the multi-layer spacer 150 and a conductive layer formed on the barrier layer. According to embodiments of the inventive concept, the barrier layer may have a Ti/TiN stack structure.

Meanwhile, when the buried contacts 180 are formed of a metal, a metal silicide layer may be formed between the buried contacts 180 and the active region 116. For example, the metal silicide layer may be a cobalt (Co) silicide layer. However, the metal silicide layer is not limited to a Co silicide layer. That is, a metal silicide layer may be formed of various types of metal silicide.

Figure 17A:
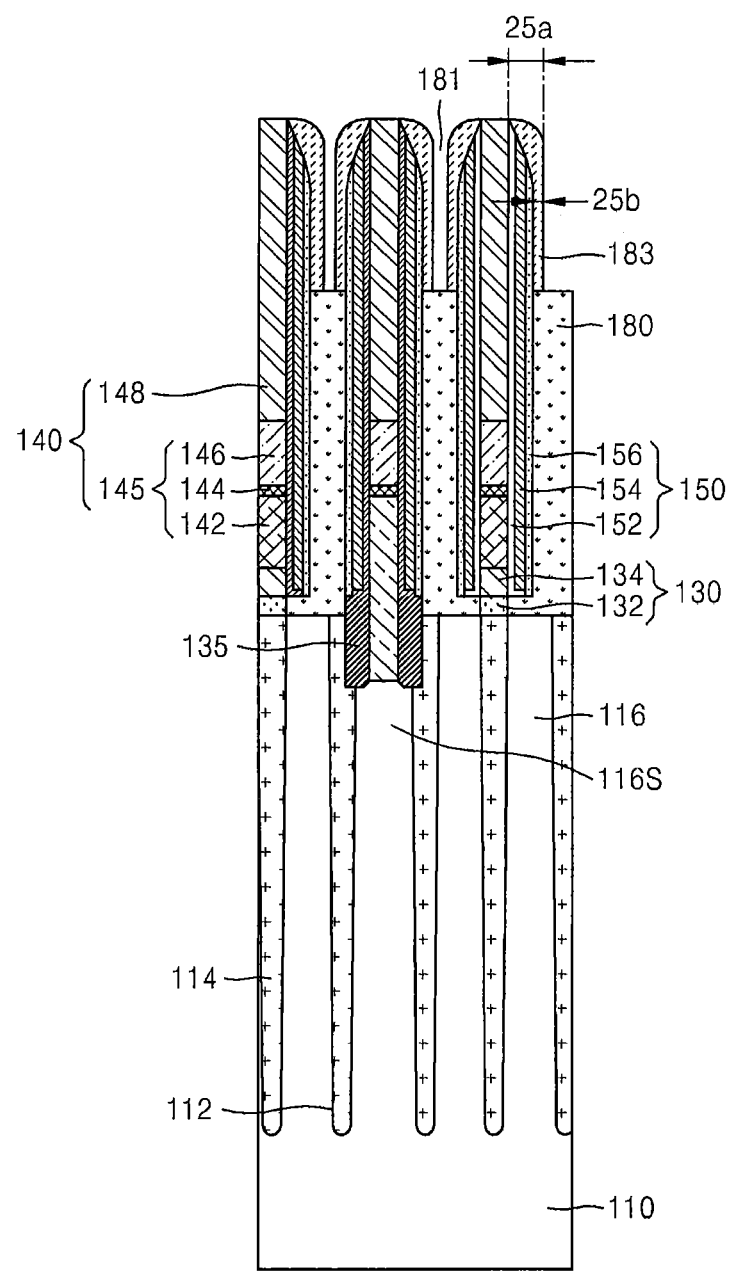
Figure 17B:
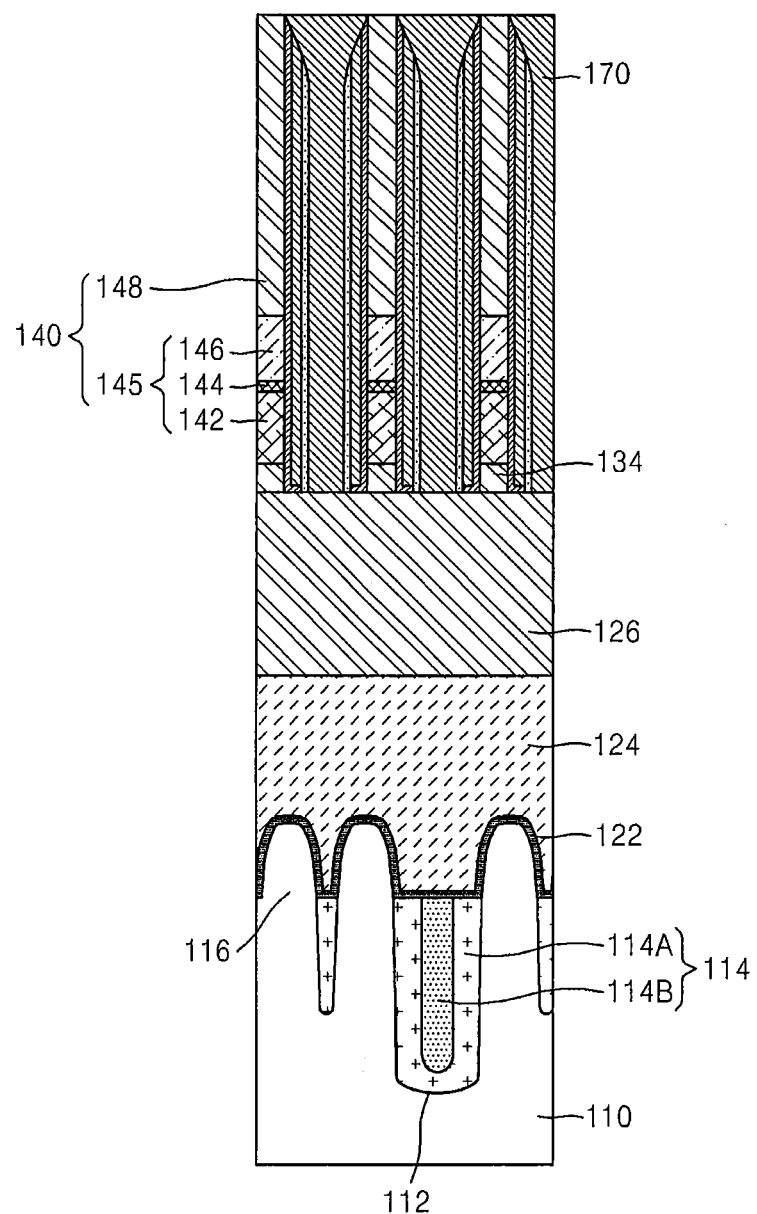
Figure 17C:
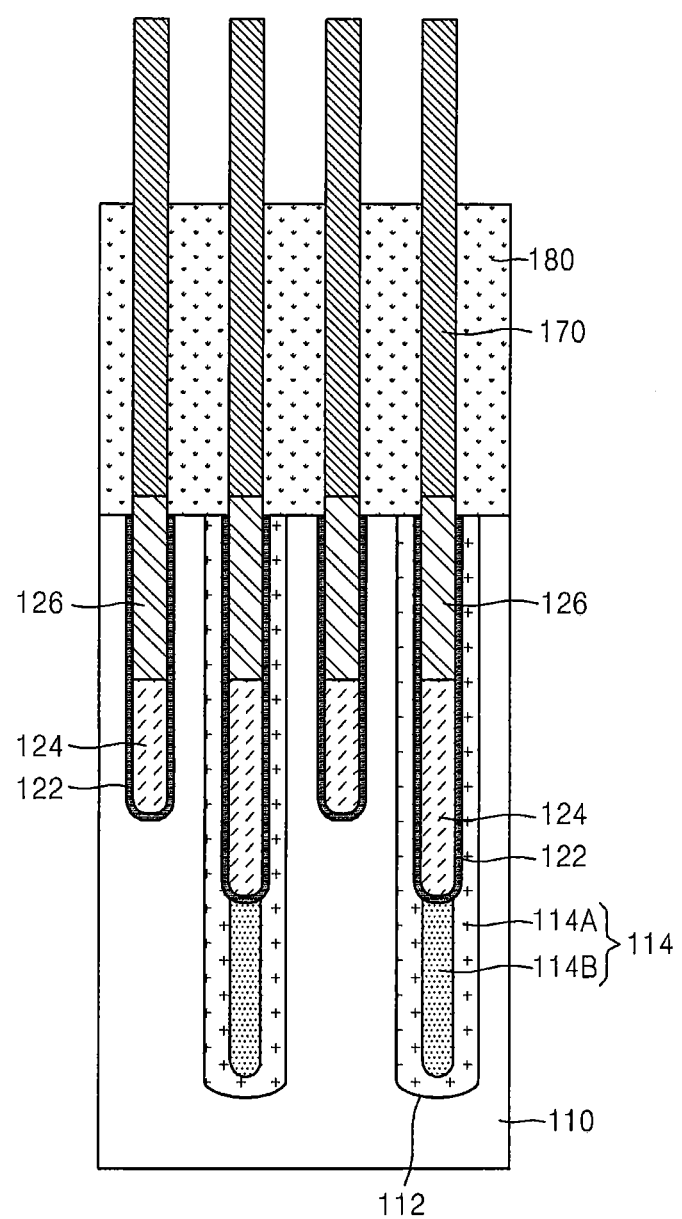

Referring to FIG. 17A, a groove 181 is formed by performing an etch-back process by removing a portion of an upper portion of the buried contacts 180. When the groove 181 is formed, the multi-layer spacer 150 whose lateral surface is etched may be exposed. The multi-layer spacer 150 may be the spacers 9 included in the second pattern structures 11 of FIGS. 1 through 14.

As described above, a lateral surface of an upper portion of the multi-layer spacer 150 may be removed during a manufacturing process. Accordingly, as has been described above with reference to FIGS. 1 through 14, the upper width or thickness 10a (see FIG. 16) of the multi-layer spacer 150 may be smaller or narrower than the lower width or thickness 10b thereof (see FIG. 16).

Next, extension spacers 183 are formed on two sidewalls of each of the multi-layer spacer 150. The extension spacers 183 may correspond to the extension patterns 13 as described above. The extension spacers 183 may deteriorate step coverage as described above, and thus, an upper width or thickness 25a thereof is greater than a middle width or thickness 25b thereof.

While just the middle widths 25b of the extension spacers 183 is illustrated in FIG. 17A, when the groove 181 having a large depth is formed, the upper width 25a of the extension spacers 183 may be greater than the lower widths 25d thereof (see FIG. 11). In addition, the manufacturing process of 17A through 17C may be implemented by applying the inventive concept illustrated in FIGS. 2 and 3.

Figure 18A:
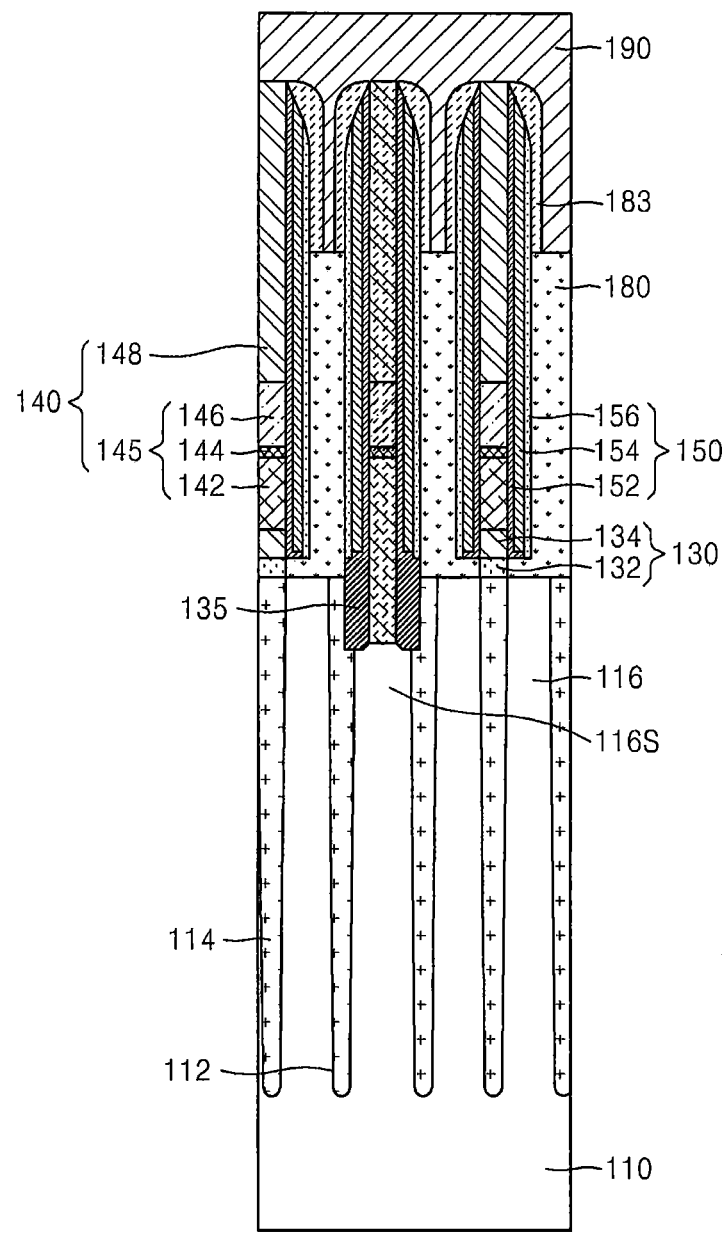
Figure 18B:
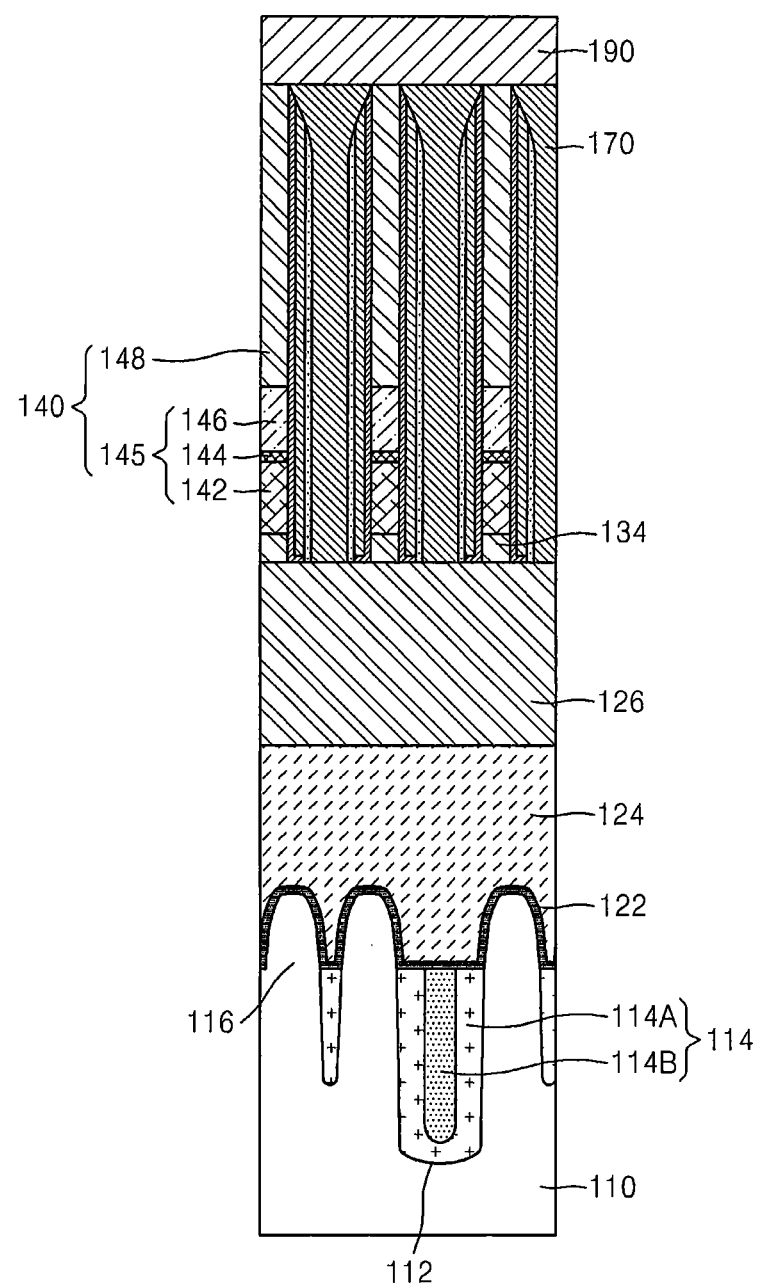
Figure 18C:
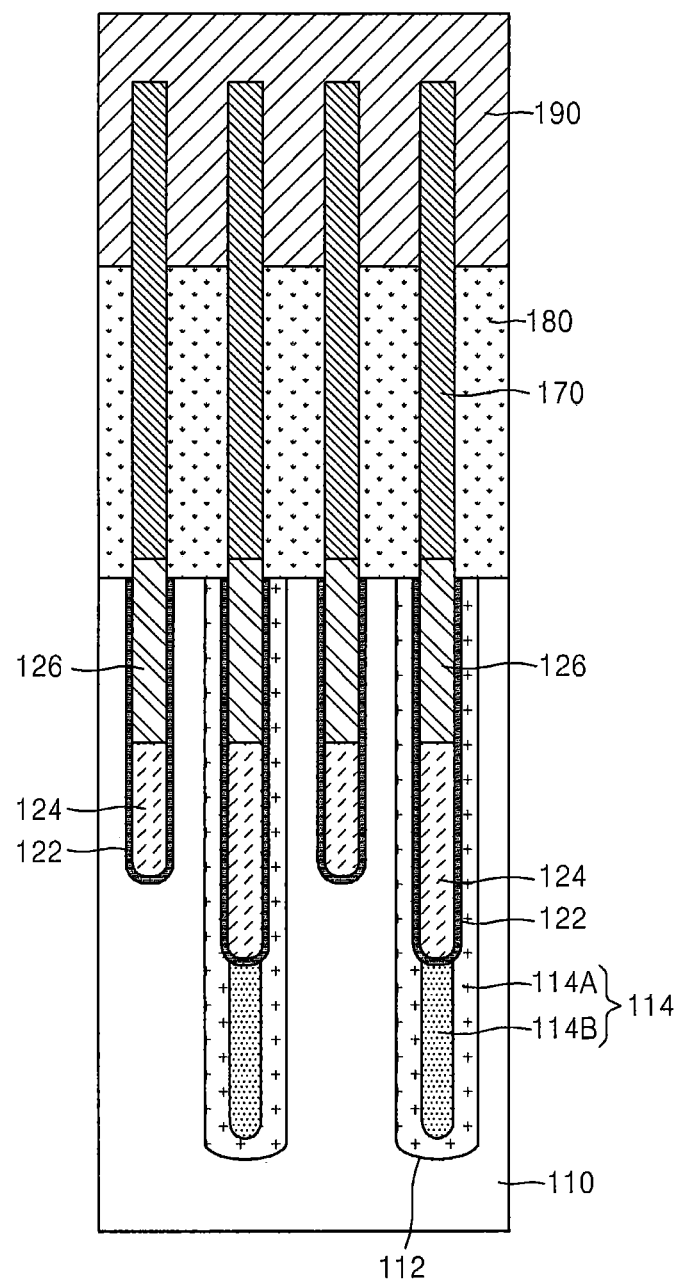

Referring to FIGS. 18A through 18C, the groove 181 formed by performing an etch-back process may be filled, and a metal layer 190 that covers the bit line structures 140 and the multi-layer spacer 150 is formed.

The metal layer 190 may include a metal silicide layer in a portion where the metal layer 190 and the buried contacts 180 contact each other. For example, the metal silicide layer may be a Co silicide layer. However, as described above, the metal silicide layer is not limited to a Co silicide layer.

According to embodiments of the inventive concept, the metal silicide layer may be formed by using the following processes.

First, a metal material layer is formed on a surface of the buried contacts 180 formed of a polysilicon exposed through a lower surface of the groove 181 formed by performing an etch-back process, and then a first rapid thermal silicidation (RTS) method is performed. The first RTS method may be performed in a temperature range of about 450° C. to about 550° C. Then, the metal material layer that has not reacted with Si atoms in the first RTS process is removed, and the metal silicide layer is formed by performing a second RTS operation at a higher temperature than the first RTS operation, for example, at about 800° C. to about 950° C. When a Co material layer is formed as the metal material layer, the above-described Co silicide layer may be formed.

The metal layer 190 may include a barrier layer that covers or extends on an inner wall of the groove 181 and the upper surfaces of the bit line structures 140 and the multi-layer spacer 150, an inner metal layer that is formed on the barrier layer and fills an inner portion of the groove 181, and a top metal layer that is formed on the barrier layer and covers the upper surfaces of the bit line structures 140 and the multi-layer spacer 150. According to embodiments of the inventive concept, the barrier layer may have a Ti/TiN stack structure. Also, according to embodiments of the inventive concept, at least one of the inner metal layer and the top metal layer may include tungsten.

According to embodiments of the inventive concept, the following operations may be performed to form the metal layer 190. First, a resultant product including the groove 181 may be cleansed by performing an etch-back process, and then the barrier layer covering the inner wall of the groove 181 may be formed on the entire surface of the resultant product. Then, the groove 181 is filled in the barrier layer, and a metal material layer covering the upper surfaces of the bit line structures 140 and the multi-layer spacers 150 is formed and planarized, thereby forming the inner metal layer and the top metal layer.

Meanwhile, according to or depending on circumstances, the inner metal layer and the upper metal layer may be separately formed. For example, after forming the metal material layer, the metal material layer may undergo the etch-back process or be polished until the barrier layer is exposed, thereby forming the inner metal layer in the groove 181. Then, a metal material layer may be formed on the barrier layer and the inner metal layer and then may be planarized, thereby forming the top metal layer.

Figure 19A:
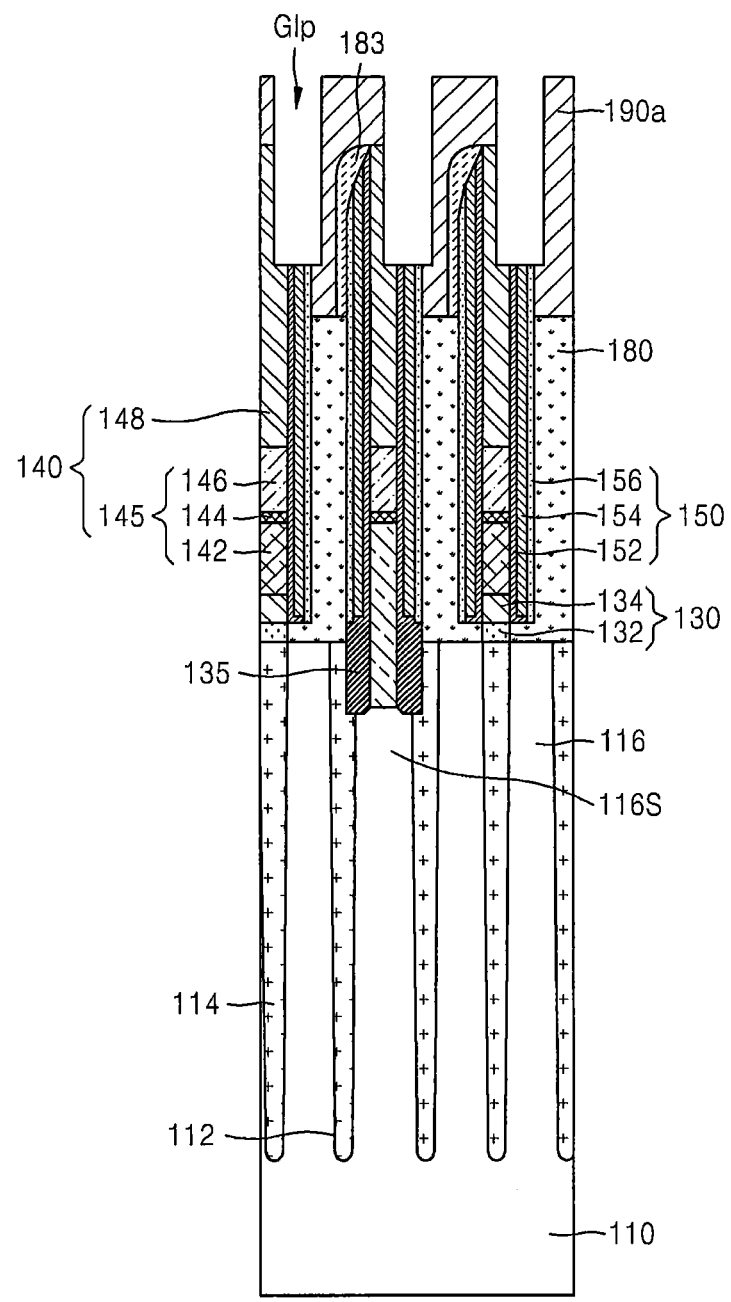
Figure 19B:
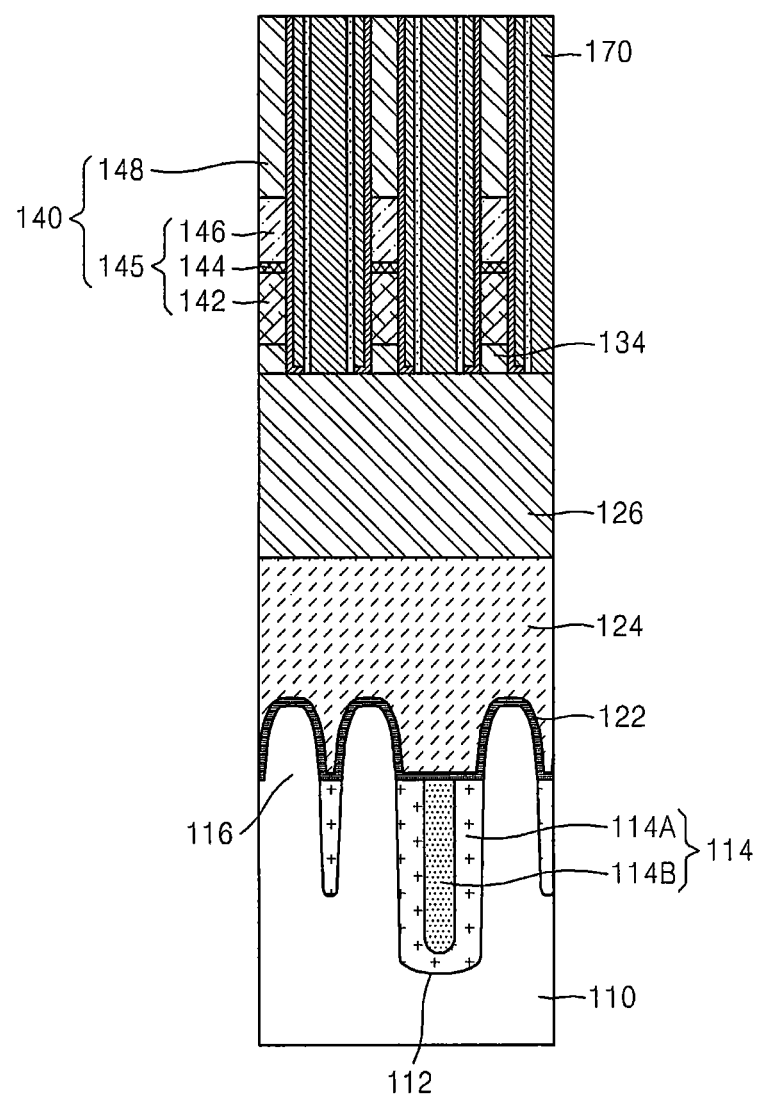
Figure 19C:
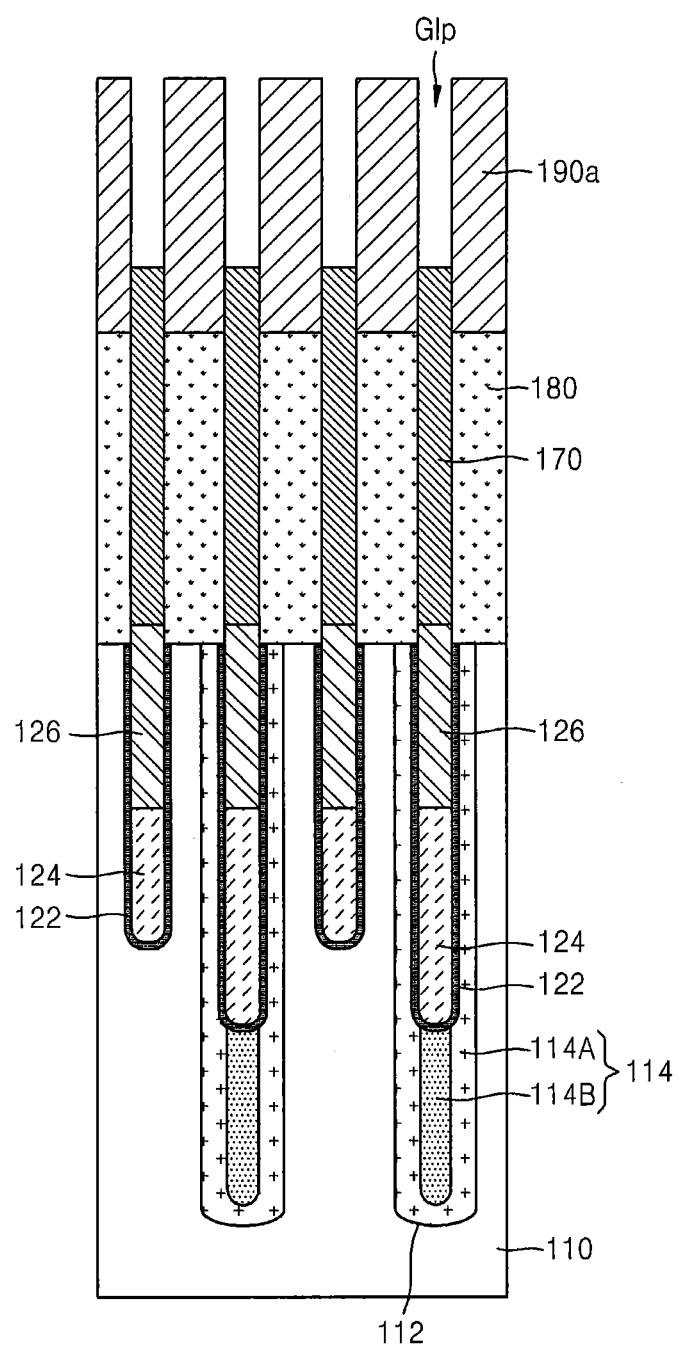

Referring to FIGS. 19A through 19C, after forming a mask pattern on the metal layer 190, the mask pattern may be used as an etching mask to partially etch portions of the metal layer 190 and portions of the bit line structures 140 and the multi-layer spacer 150 therebelow, thereby forming a plurality of landing pads 190a in the buried contacts 180, respectively.

As described above, the landing pads 190a may correspond to the conductive patterns 19 of FIGS. 1 through 14. The upper surfaces of the bit line structures 140, the upper surface of the multi-layer spacer 150, and the upper surfaces of the extension spacers 183 may be increased due to the extension spacers 183, and vertical sidewall inclination profiles of the bit line structures 140, the multi-layer spacers 150, and the extension spacers 183 may be formed. Accordingly, when forming the landing pads 190a by using a photolithography method, a misalignment margin between the bit line structures 140 and the landing pads 190a may be increased, and formation of bridges between the landing pads 190a may be reduced or prevented.

As described above, by forming a greater upper width or thickness than a lower width or thickness of the extension spacers 183, an open surface area of the buried contacts 180 may be increased. When the buried contacts 180 have a large open surface area, contact resistance between the landing pads 190a may be reduced.

The mask pattern may have island forms that are respectively similarly separated from the landing pads LP illustrated in FIG. 15. Accordingly, during an operation of forming the landing pads 190a by using the mask pattern as an etching mask, grooves Glp for landing pads are formed as illustrated in FIG. 19A, and via the grooves Glp for the landing pads, the landing pads 190a may be separated from one another and may be insulated from one another. Also, lateral surfaces of the bit line structures 140 and an upper surface of the multi-layer spacer 150 may be exposed through the grooves Glp for the landing pads.

In detail, while the landing pads 190a are formed, that is, while the grooves Glp for the landing pads are formed, the upper portion of the insulation capping line 148 of the bit line structures 140 and an upper portion of the multi-layer spacer 150 formed on sidewalls of the insulation capping line 148 are removed, and accordingly, the lateral surface of the insulation capping line 148 and the upper surface of the multi-layer spacer 150 may be exposed through the grooves Glp for the landing pads.

Meanwhile, as illustrated in FIG. 19A, while forming the grooves Glp for the landing pads, a right lateral surface of the insulation capping line 148 is removed, and also, only an upper portion of the multi-layer spacer 150 of the lateral sidewall of the insulation capping line 148 may be removed. Accordingly, the landing pads 190a may have a structure on or covering the left portion of the insulation capping line 148 and the multi-layer spacer 150 on the left sidewall of the insulation capping line 148. Also, the landing pads that are arranged in another line adjacent to the line I-I' of FIG. 15 may have an opposite structure, that is, may have a structure on or covering the right portion of the insulation capping line 148 and the multi-layer spacer 150 on the right sidewall of the insulation capping line 148.

As a result, similarly to the landing pads LP of FIG. 15, the landing pads 190a are arranged in a zigzag structure or pattern (see the line L1 of FIG. 1) in which the multi-layer spacer 150 on the left sidewall of the bit line structures 140 and the multi-layer spacer 150 on the right side wall are alternately covered, and also, the landing pads 190a may cover, along the first direction (x-direction), the multi-layer spacer 150 formed on the sidewalls of the bit line structures in the same direction. After forming the landing pads 190a, the mask pattern is removed.

After removing the mask pattern, the grooves Glp for the landing pads are filled, and a capping insulation layer covering the upper surface of the landing pads 190a may be formed. Also, a plurality of capacitors that pass through the capping insulation layer to be electrically connected to the landing pads 190a, that is, bottom electrodes, dielectric bodies, and top electrodes, may be formed.

For reference, bit lines 145 and landing pads 190a may respectively correspond to the bit lines BL and landing pads LP illustrated in FIG. 15, and the buried contacts 180 and the direct contacts 135 may respectively correspond to the buried contacts BC and the direct contacts DC illustrated in FIG. 15.

FIGS. 20 through 25 are cross-sectional views illustrating the semiconductor device 100 of FIG. 15 and methods of fabricating the semiconductor device 100, according to other embodiments of the inventive concept. FIGS. 20A, 21A, 22A, 23A, 24A, and 25A are cross-sectional views taken along a line I-I' of FIG. 15, FIGS. 20B, 21B, 22B, 23B, 24B, and 25B are cross-sectional views taken along a line II-II' of FIG. 15, and FIGS. 20C, 21C, 22C, 23C, 24C, and 25C are cross-sectional views taken along a line III-III' of FIG. 15. In FIGS. 20 through 25, like reference numerals as in FIGS. 16 through 19 denote like elements, and descriptions thereof will be omitted.

Referring to FIG. 20, as described above with reference to FIG. 16, an upper portion of the conductive material layer is removed by using a CMP method such that upper surfaces of the bit lines structures 140 and the multi-layer spacer 150 are exposed, thereby forming a plurality of buried contacts 180. The buried contacts 180 may correspond to the contact patterns 17 of FIGS. 1 through 14.

Figure 20A:
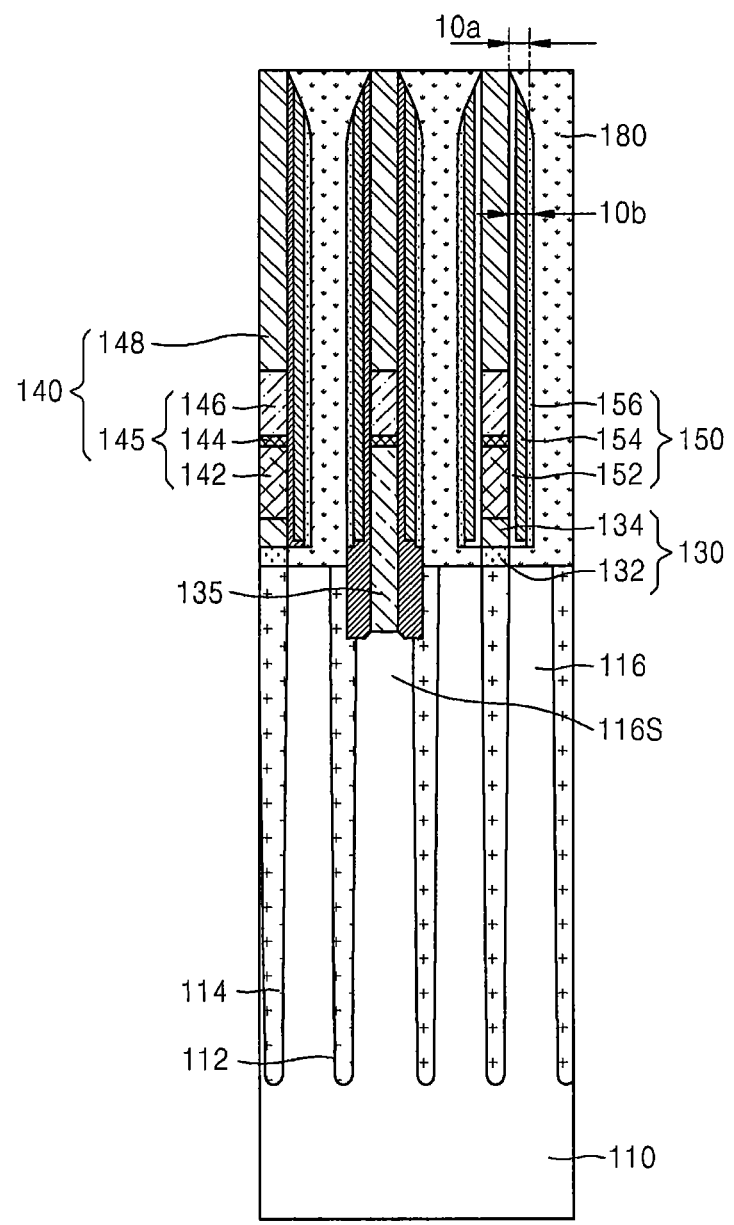
FIGS. 20A, 20B, 20C, 21A, 21B, 21C, 22A, 22B, 22C, 23A, 23B, 23C, 24A, 24B, 24C, 25A, 25B, and 25C are cross-sectional views illustrating the semiconductor device of FIG. 15 and a method of fabricating the semiconductor device of FIG. 15, according to other embodiments of the inventive concept.
Figure 20B:
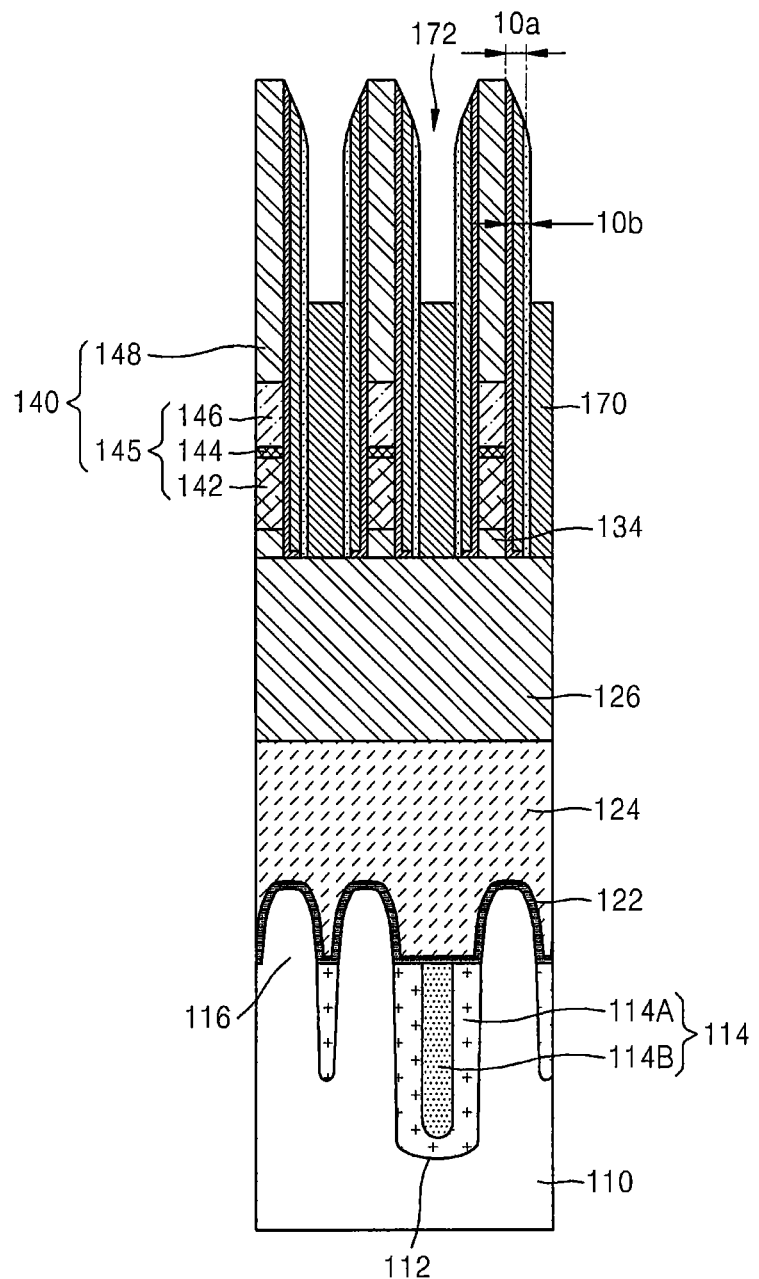

As illustrated in FIG. 20B, an upper portion of the first insulation layer 170 is removed to form a groove 172. As described above, the first insulation layer 170 is formed of an oxide material, and thus, the first insulation layer 170 may be removed by performing dry etching or performing an etch-back process by using the buried contacts 180 formed of polysilicon and the bit line structures 140 formed of a nitride material and the multi-layer spacer 150 as an etching mask.

Figure 20C:
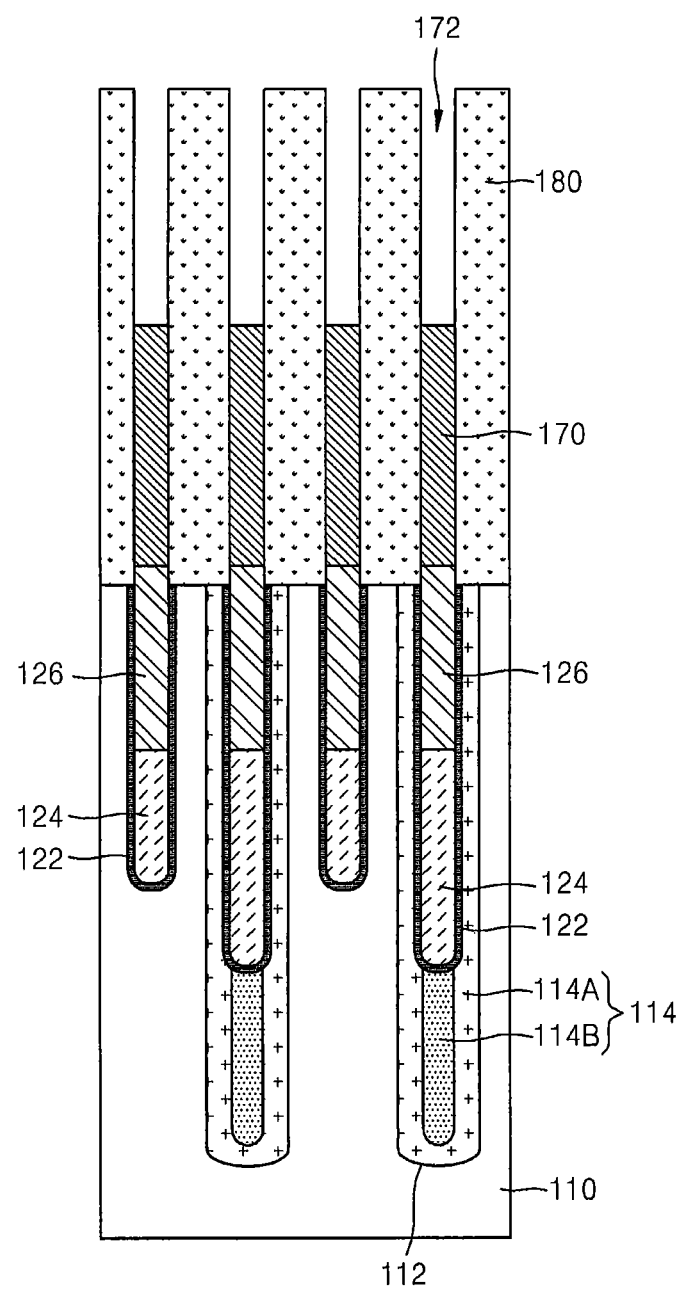
Figure 21A:
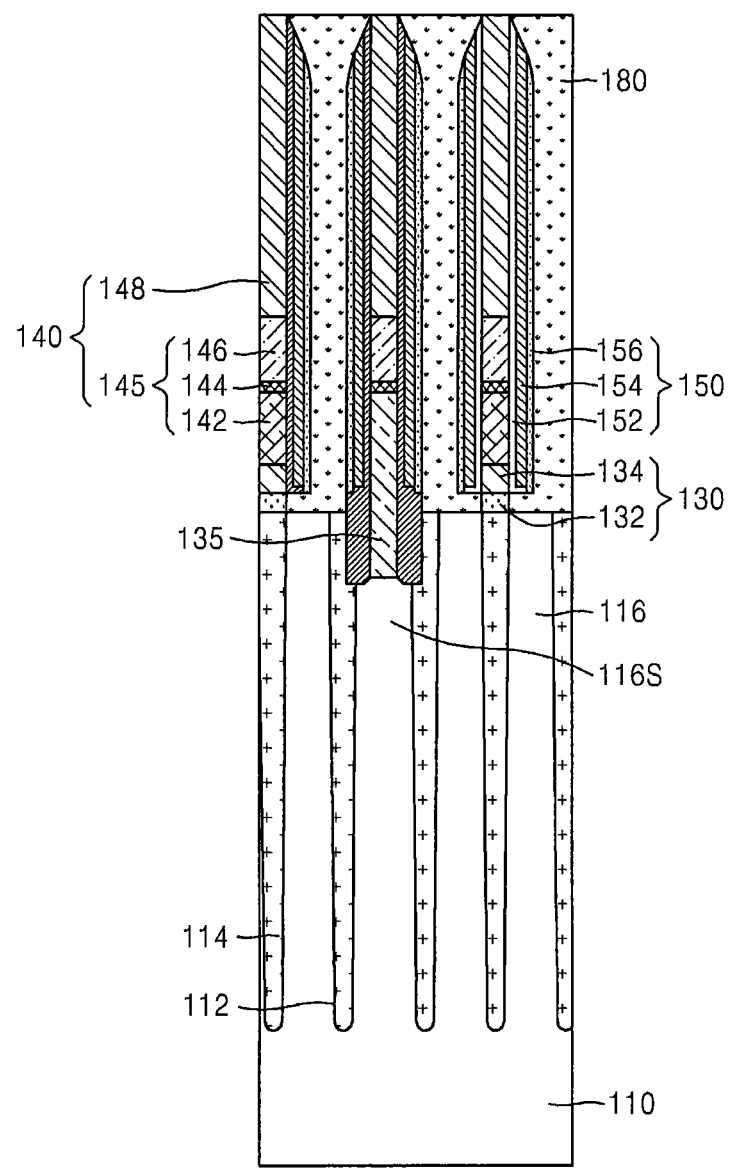
Figure 21B:
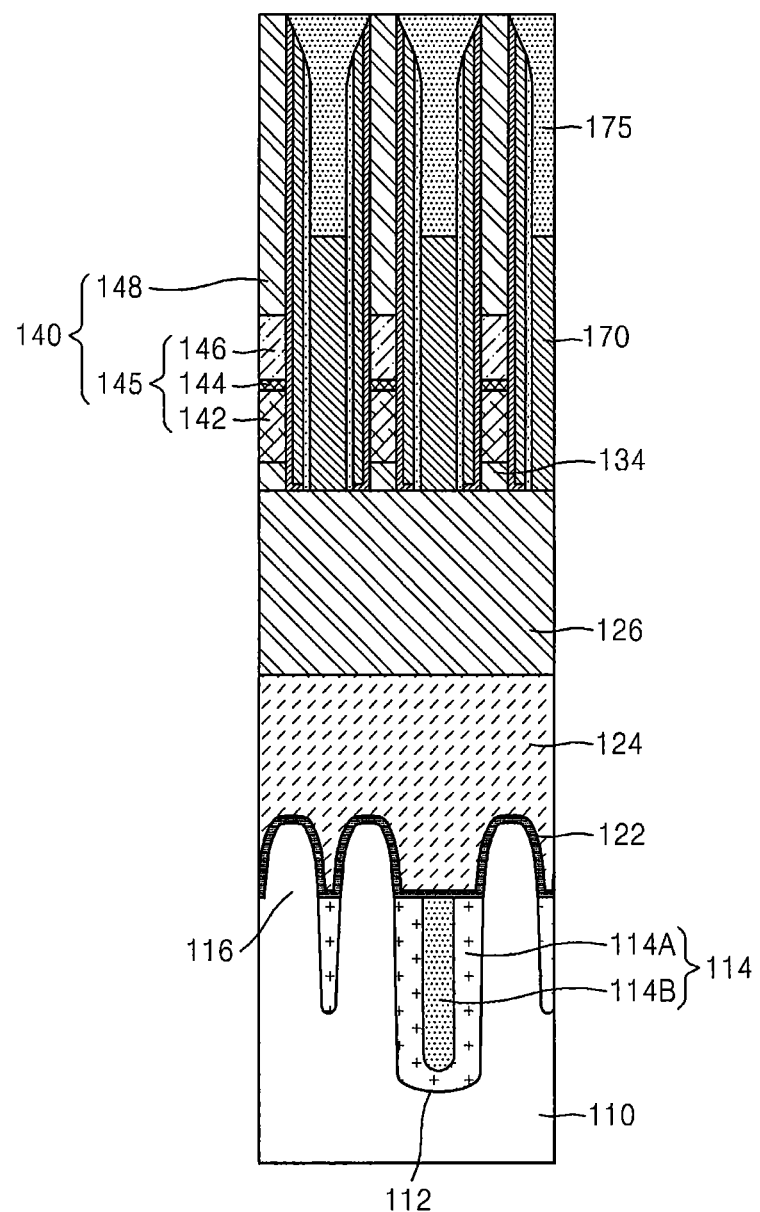
Figure 21C:
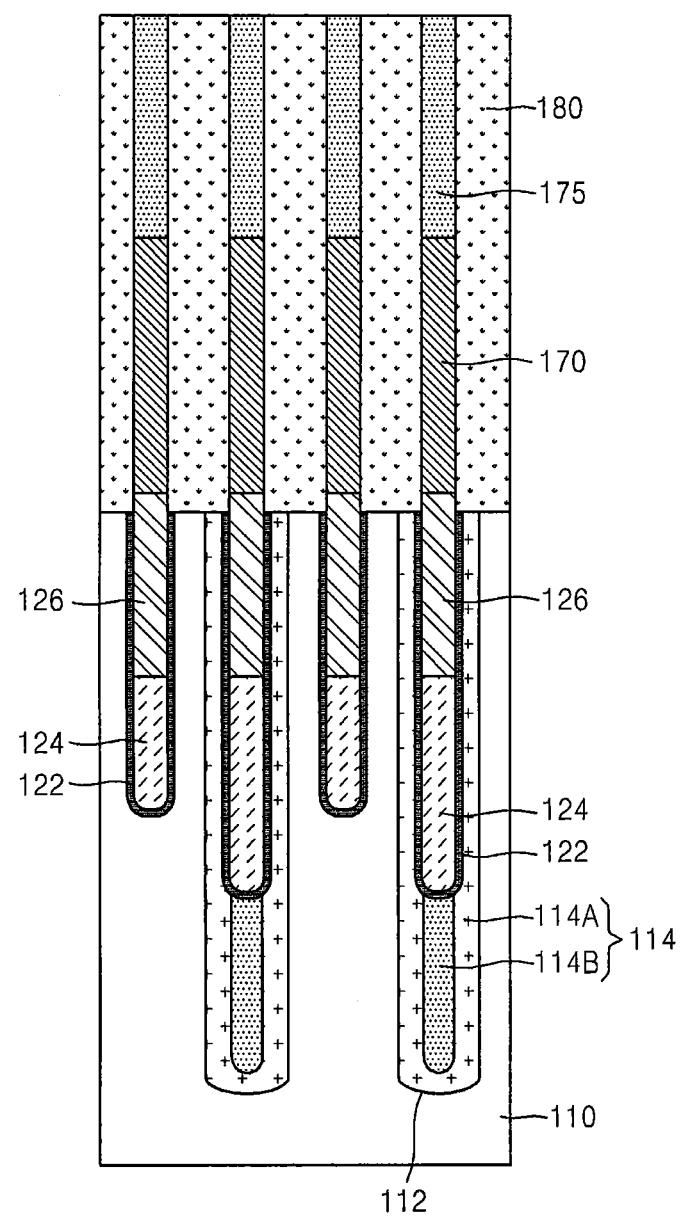

As is shown in FIG. 20C, an upper surface of the first insulation layer 170 remaining after the etching may be maintained at a level lower than the upper surface of the buried contacts 180 that are to remain later after performing the etch-back process. However, a height of the upper surface of the first insulation layer 170 is not limited thereto. For example, the upper surface of the first insulation layer 170 may be maintained at the same level as or a higher level than the upper surface of the buried contacts 180 after performing the etch-back process. However, when the upper surface of the first insulation layer 170 is maintained at the same level as or a higher level than the upper surface of the buried contacts 180 after performing the etch-back process, the first insulation layer 170 is not to be exposed through the grooves Glp for the landing pads in a subsequent process of forming the landing pads 190a.

Referring to FIG. 21, the groove 172 is filled, and a material layer formed of a nitride material that covers the upper surfaces of the bit line structures 140 and the multi-layer spacer 150 is formed. Then, the upper portion of the material layer is removed such that the upper surfaces of the bit line structures 140 and the multi-layer spacer 150 are removed, thereby forming a second insulation layer 175 formed of a nitride material. The second insulation layer 175 may perform the function of protecting the first insulation layer 170 formed of an oxide material therebelow when forming an air spacer.

Figure 22A:
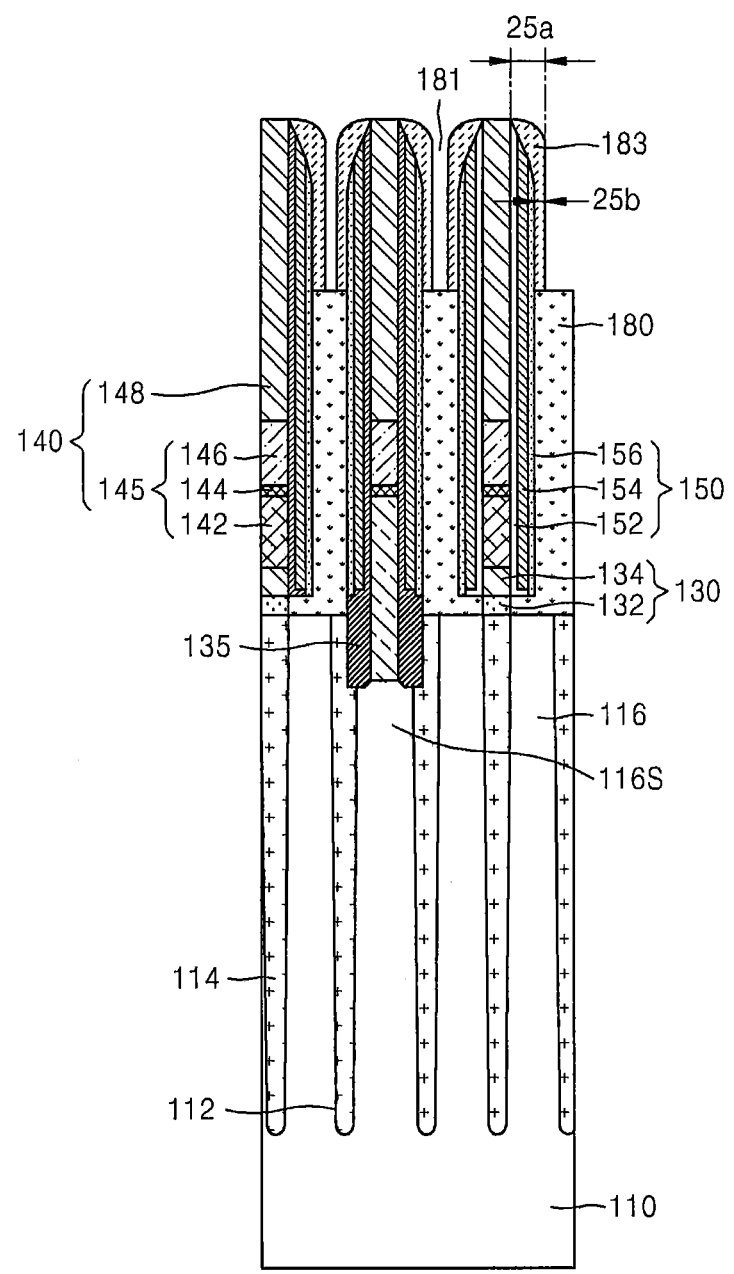
Figure 22B:
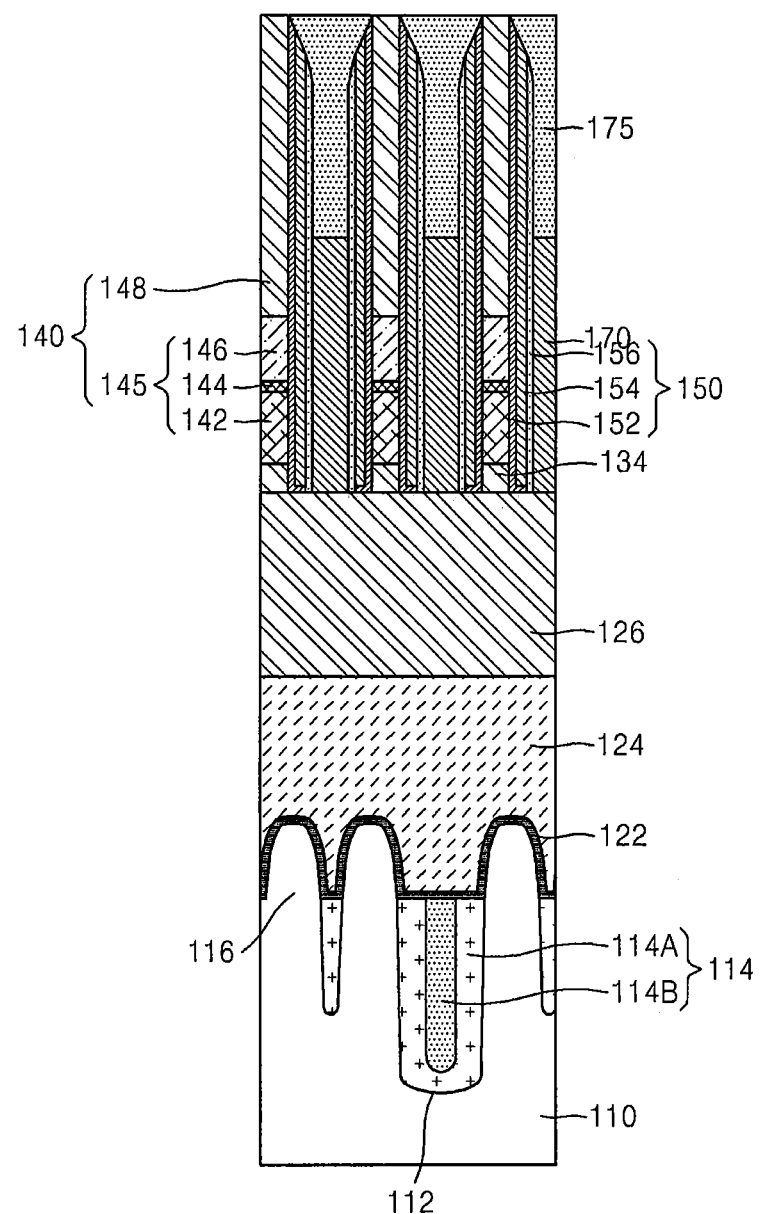
Figure 22C:
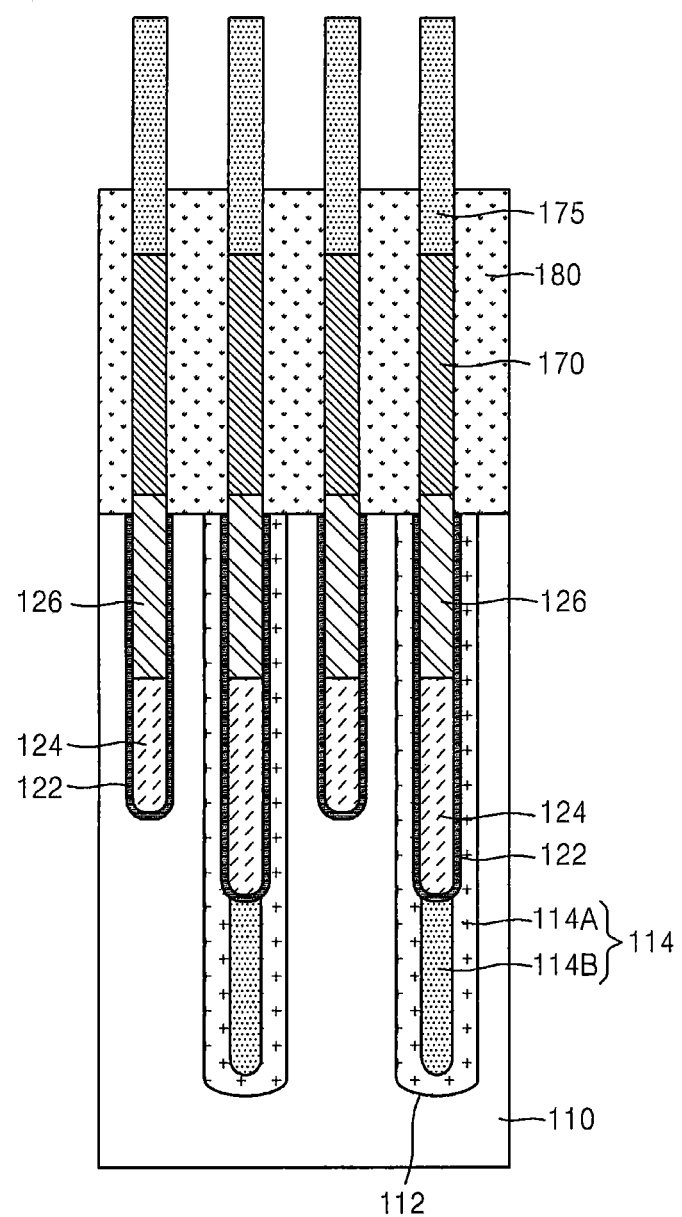
Figure 23A:
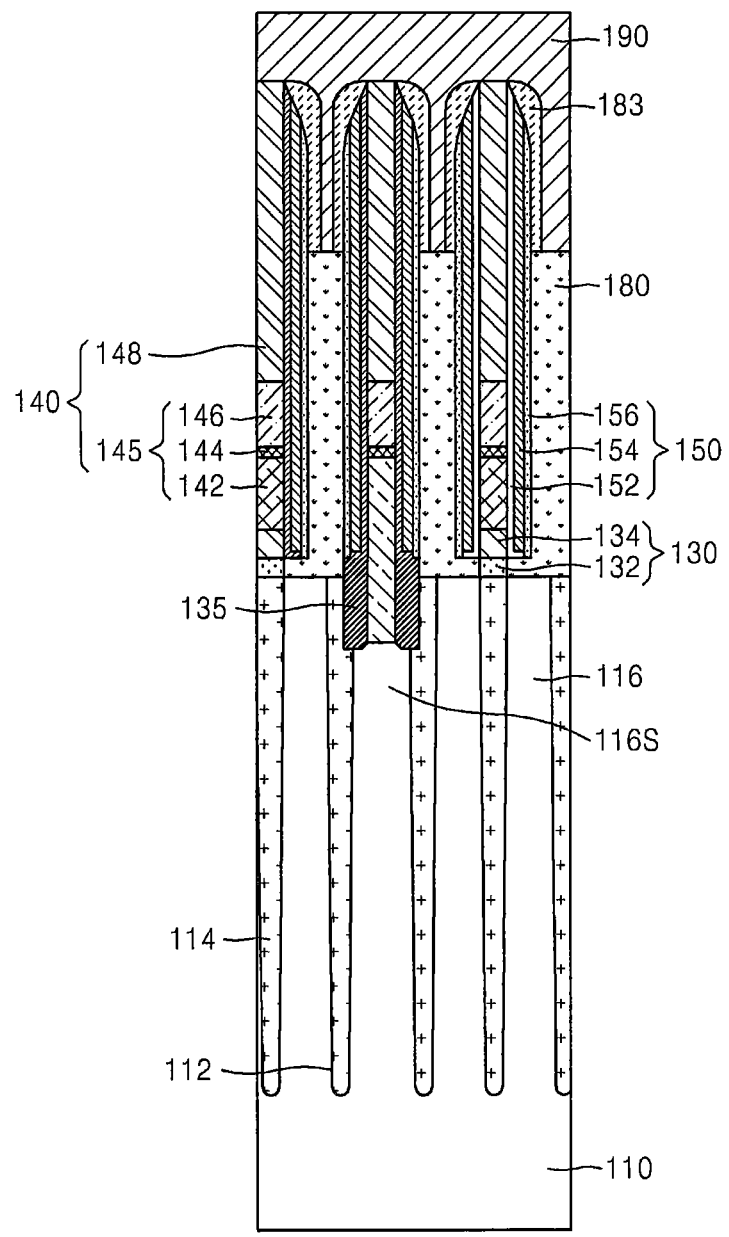
Figure 23B:
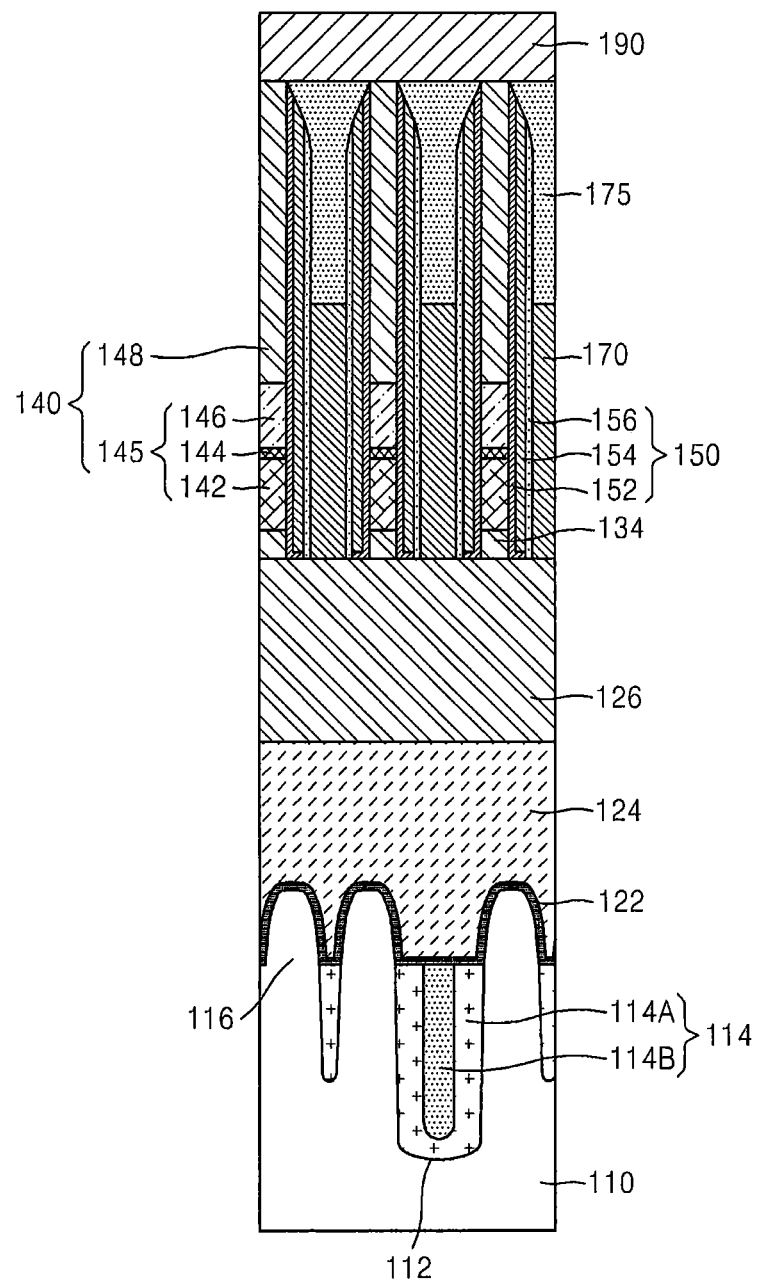
Figure 23C:
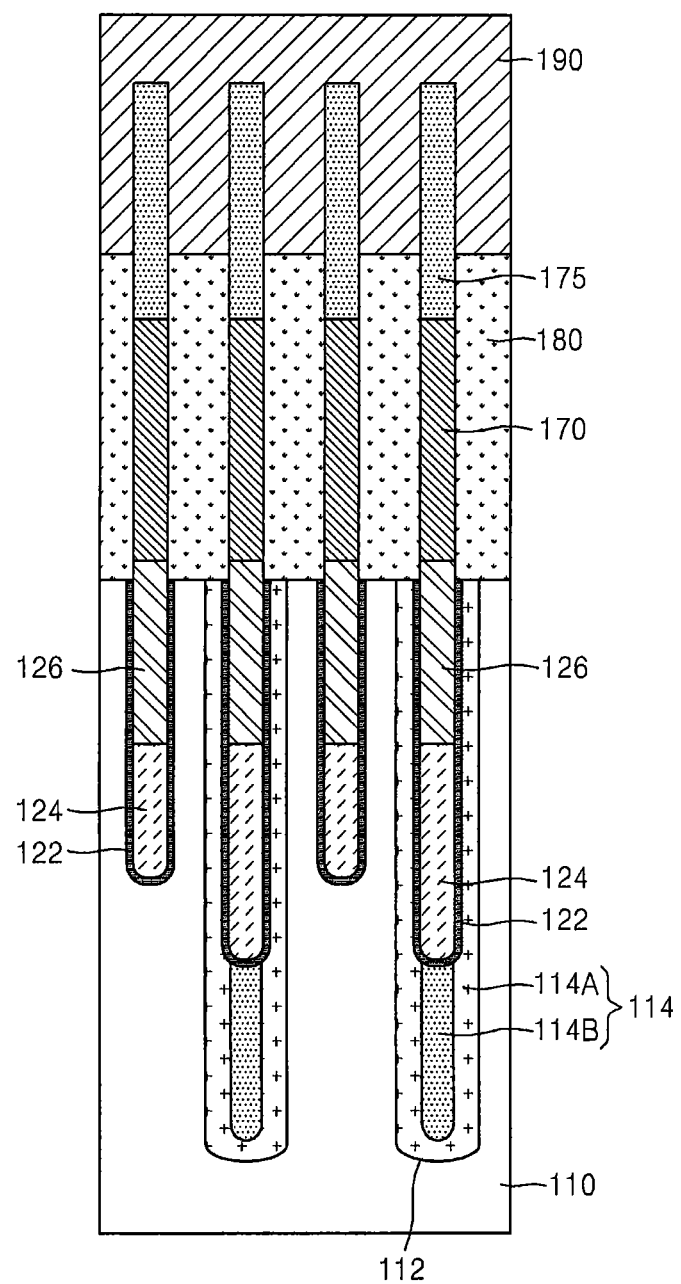
Figure 24A:
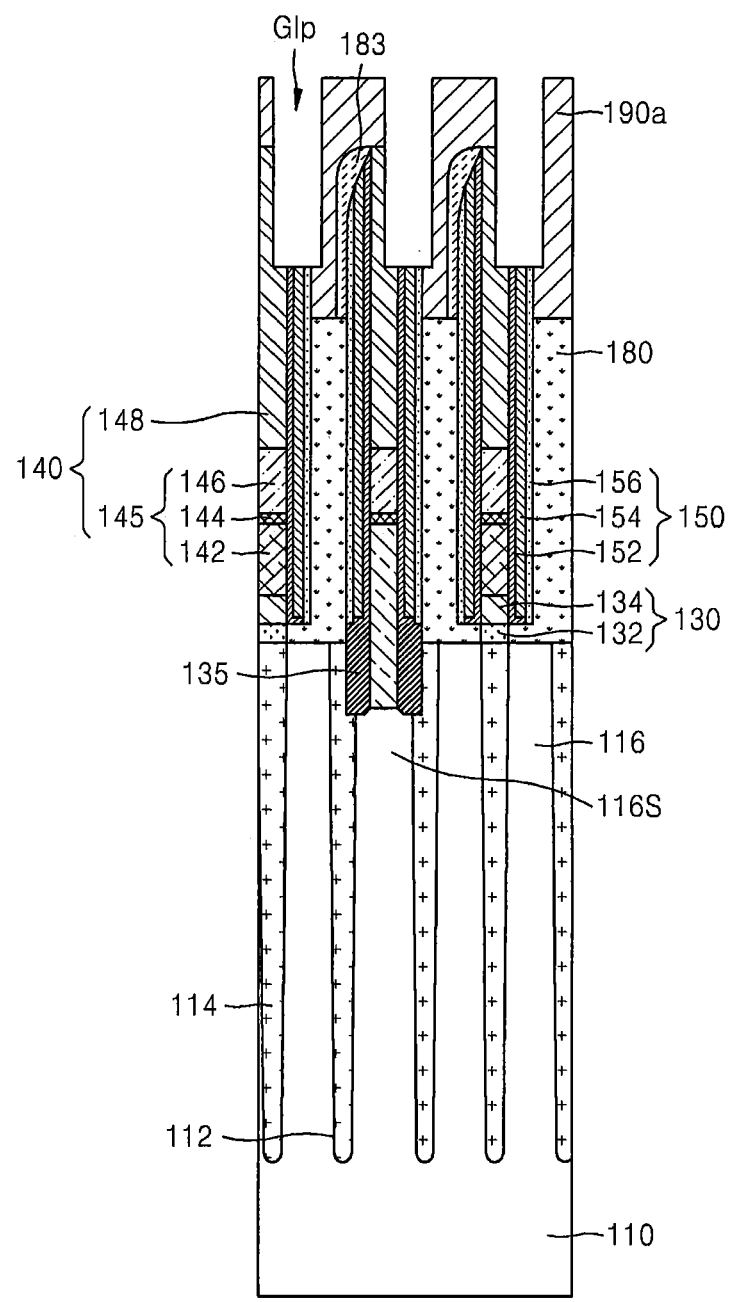
Figure 24B:
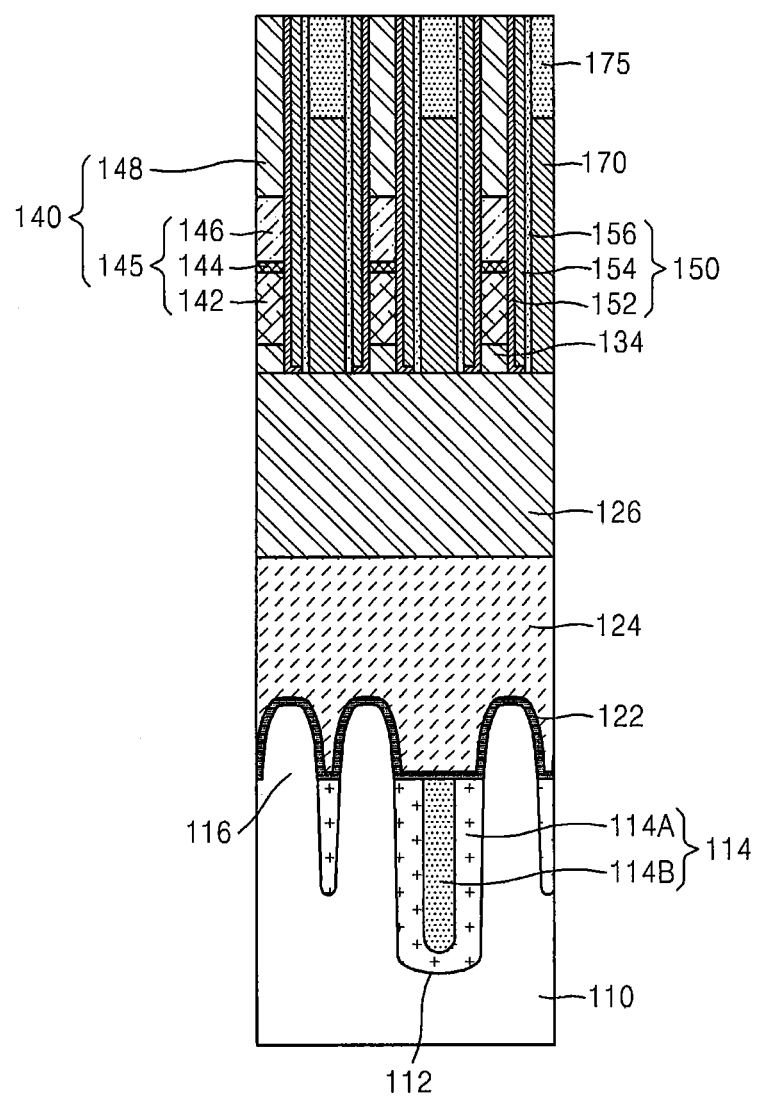
Figure 24C:
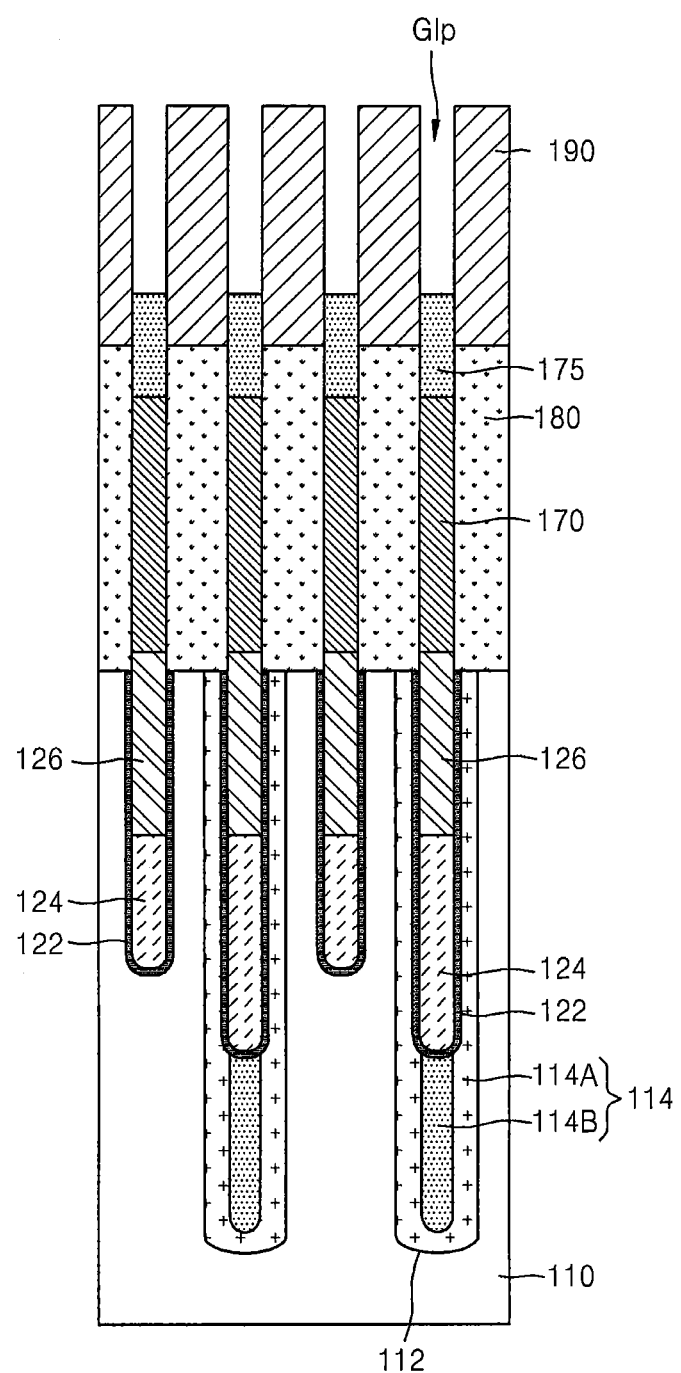
Figure 25A:
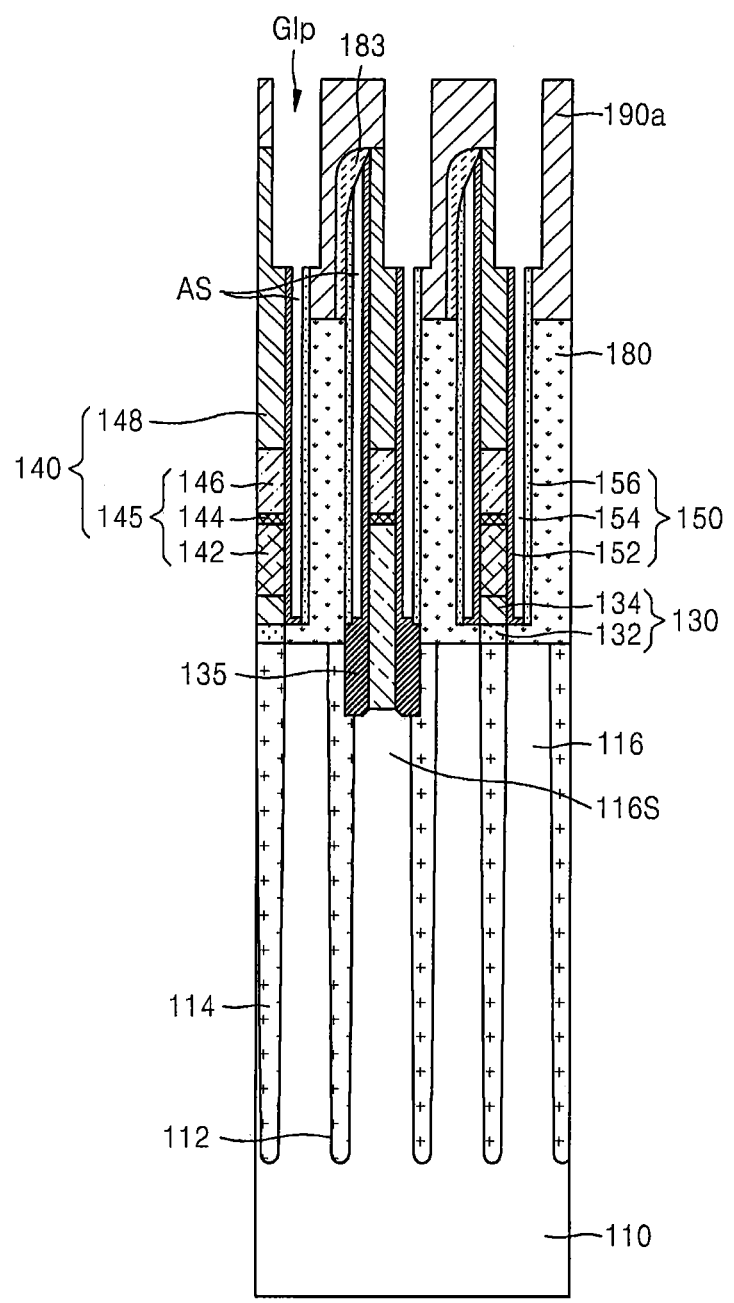
Figure 25B:
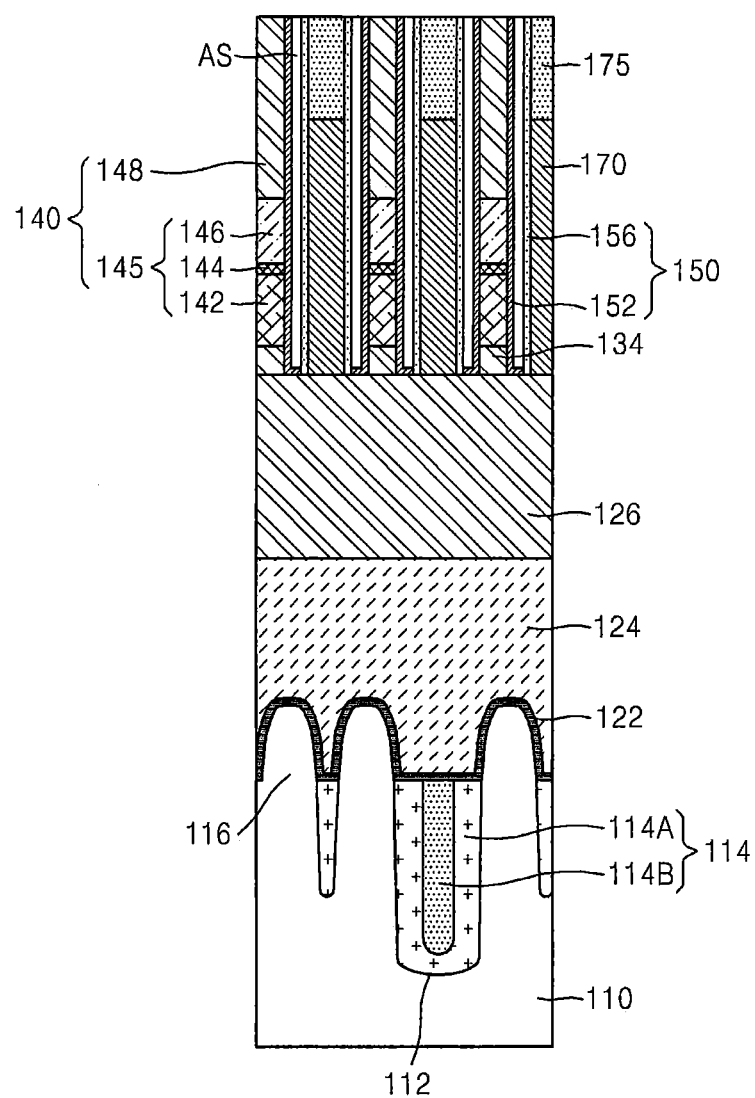
Figure 25C:
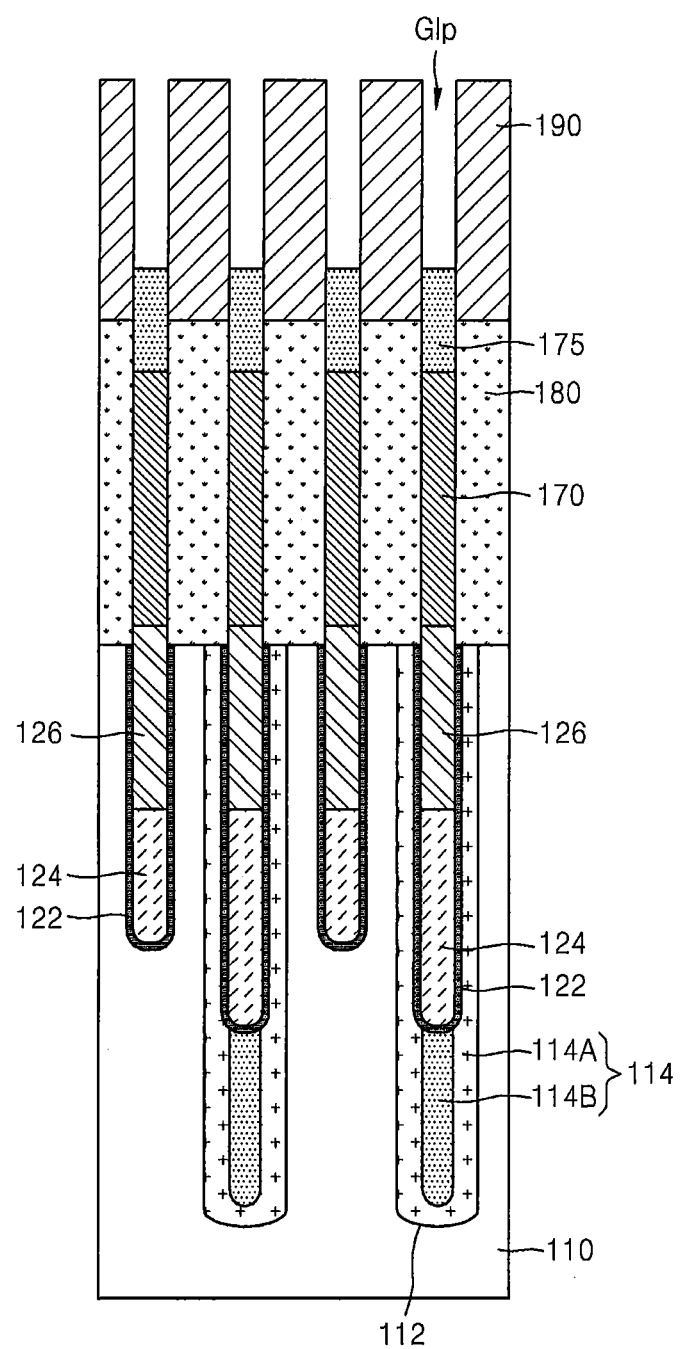

Referring to FIG. 22A, similarly to FIG. 17, a portion of an upper portion of the buried contacts 180 is removed by performing an etch-back process to form a groove 181. When forming the groove 181, the multi-layer spacer 150 whose lateral surface is etched may be exposed. The multi-layer spacer 150 may be the spacers 9 included in the second pattern structures 11 of FIGS. 1 through 14.

Lateral portions of upper portions of the multi-layer spacer 150 may be removed during a manufacturing process as described above. Accordingly, as described above with reference to FIGS. 1 through 14, the upper width or thickness 10*a* (FIG. 20) of the multi-layer spacer 150 may also be smaller or narrower than the lower width or thickness 10*b* (FIG. 20).

Extension spacers 183 are formed on two opposing sidewalls of each of the multi-layer spacers 150. As described above, the extension spacers 183 may correspond to the extension patterns 13. As described above, the extension spacers 183 may deteriorate step coverage so that the upper width or thickness 25*a* may be greater than the middle width or thickness 25*b* therebelow. The manufacturing operation regarding FIG. 22 has been described above with reference to FIG. 17, and thus a description thereof will be omitted.

Referring to FIG. 23, similarly to FIG. 18, the groove 181 formed by performing the etch-back process is filled, and a metal layer 190 covering the bit line structures 140 and the multi-layer spacer 150 is formed.

The metal layer 190 may include a metal silicide layer in a contact portion with respect to the buried contacts 180. For example, the metal silicide layer may be a Co silicide layer. Also, the metal layer 190 may include a barrier layer that covers upper surfaces of the bit line structures 140 and the multi-layer spacer 150, an inner metal layer that is formed on the barrier layer and fills an inner portion of the groove 181, and a top metal layer that is formed on the barrier layer and covers the upper surfaces of the bit line structures 140 and the multi-layer spacer 150. According to embodiments of the inventive concept, the barrier layer may have a Ti/TiN stack structure. Also, according to embodiments of the inventive concept, at least one of the inner metal layer and the top metal layer may include tungsten.

Referring to FIG. 24, similarly to FIG. 19, a plurality of conductive landing pads 190*a* is formed. That is, a mask pattern is formed on the metal layer 190, and then the mask pattern is used as an etching mask to etch the metal layer 190 and portions of the bit line structures 140 and the multi-layer spacer 150 therebelow, thereby forming grooves Glp for landing pads. Accordingly, a plurality of landing pads 190*a* that are respectively connected to the buried contacts 180, electrically insulated from one another, and physically separated from one another are formed. The landing pads 190*a* may correspond to the conductive patterns 19 of FIGS. 1 through 14.

The operation of forming the landing pads 190*a* according to the current embodiment of the inventive concept may be different from the operation of forming the landing pads 190*a* of FIG. 19 in that a portion of the second insulation layer 175 is removed by etching. That is, when forming the landing pads 190*a* of FIG. 19, an upper portion of the first insulation layer 170 formed of an oxide material is removed together with the bit line structures 140 and the multi-layer spacer 150, whereas when forming the landing pads 190*a* according to the current embodiment of the inventive concept, an upper portion of the second insulation layer 175 which is formed of a nitride material may be removed together with the bit line structures 140 and the multi-layer spacer 150.

Meanwhile, similarly to the landing pads LP of FIG. 15, the landing pads 190*a* according to the current embodiment of the inventive concept are also arranged in a zigzag form or pattern L1 in which the multi-spacer 150 on the left sidewall of the bit line structures 140 and the multi-layer spacer 150 on the right sidewall are alternately covered. Also, the landing pads 190*a* may also cover, along the first direction (x-axis), the multi-layer spacer 150 formed on sidewalls of the bit line structures 140 in the same direction. After forming the landing pads 190*a*, the mask pattern is removed.

Referring to FIG. 25, the first spacer 154 formed of an oxide material and exposed through the grooves Glp for the landing pads, is removed to form a plurality of air spacers AS. The air spacers AS may be formed by, for example, wet etching. However, removal may also be performed by dry etching.

As described above, when performing wet etching to form the air spacers AS, the second insulation layer 175 performs the function of preventing etching of the first insulation layer 170 therebelow. That is, if the second insulation layer 175 is not formed, the first insulation layer 170 may be exposed through the grooves Glp for the landing pads. As the first insulation layer 170 is formed of an oxide material, in the wet etching process for forming the air spacer AS, the first insulation layer 170 may be etched with the first spacer 154. As the first insulation layer 170 (which may function as a fence) is etched, the buried contacts 180 adjacent thereto may be exposed and damaged.

Meanwhile, in order to increase a width of the air spacers AS, portions of the first spacer 152 and the third spacers 156 which are formed of a nitride material may be further removed by wet etching or dry etching. Also, when increasing the width of the air spacers AS, a portion of an upper portion of the second insulation layer 175 may also be removed.

As described above, the grooves Glp for the landing pads may be filled, and a capping insulation layer covering upper surfaces of the landing pads 190*a* may be formed. Meanwhile, while forming a capping insulation layer 178, an insulation material, of which the capping insulation layer is formed, may be deposited in the air spacers AS whose upper surfaces are exposed through the grooves Glp for the landing pads.

As a result, except for the portion of the air spacers AS covered by the landing pads 190*a*, a capping liner formed of the same material as the capping insulation layer may be formed on an inner wall of the air spacers AS. However, according to or depending on circumstances, the capping liner may not be formed in the air spacers AS. After forming the capping insulation layer, a plurality of capacitors that pass through the capping insulation layer and are electrically connected to the landing pads 190*a*, that is, a bottom electrode, a dielectric body, and a top electrode, may be formed.

Figure 26:
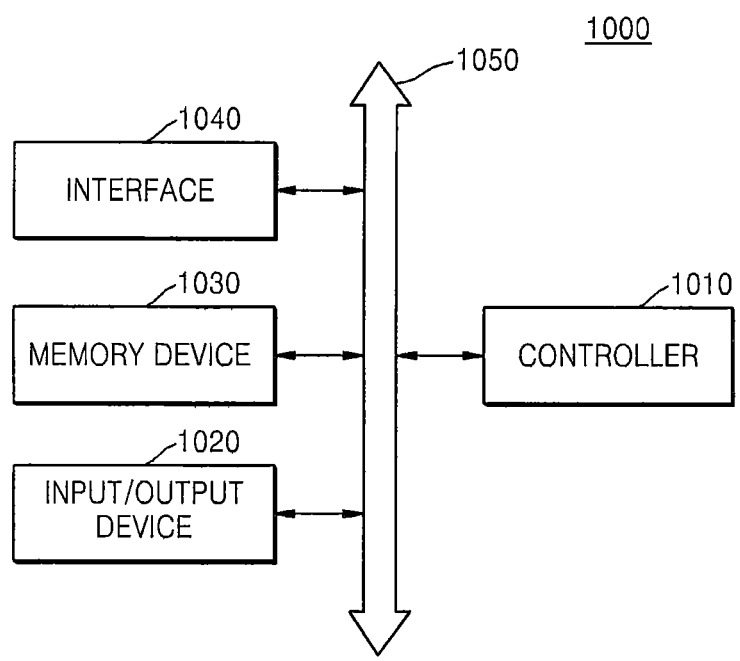
FIG. 26 illustrates a system including a semiconductor device according to some embodiments of the inventive concept.

FIG. 26 illustrates a system 1000 including a semiconductor device, according to some embodiments of the inventive concept.

In detail, the system 1000 may include a controller 1010, an input/output device 1020, a memory device 1030, and an interface 1040. The system 1000 may be a mobile system or a system that transmits or receives information. According to embodiments of the inventive concept, the mobile system may be, for example, a personal digital assistant (PDA), a portable computer, a web tablet, a wireless phone, a mobile phone, a digital music player, or a memory card.

The controller 1010 controls an execution program in the system 1000, and may include a microprocessor, a digital signal processor, a microcontroller, or other similar devices. The input/output device 1020 may be used in inputting or outputting data of the system 1000. The system 1000 may be connected to an external device such as a personal computer or a network, by using the input/output device 1020, and may exchange data with the external device. The input/output device 1020 may be, for example, a keypad, a keyboard, or a display.

The memory device 1030 may store codes and/or data for operating the controller 1010 or may store data processed by using the controller 1010. The memory device 1030 may include semiconductor devices according to embodiments of the inventive concept. For example, the memory device 1030 may include at least one of the semiconductor devices manufactured according to the above-described embodiments of the inventive concept.

The interface 1040 may be a data transmission path between the system 1000 and other external devices. The controller 1010, the input/output device 1020, the memory device 1030, and the interface 1040 may communicate with one another via a bus 1050.

The system 1000 according to the current embodiment of the inventive concept may be used in, for example, a mobile phone, a MP3 player, a navigation device, a portable multimedia player (PMP), a solid state disk (SSD), or household appliances.

Figure 27:
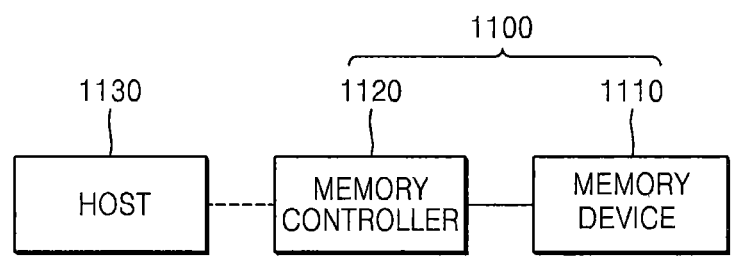
FIG. 27 is a memory card including a semiconductor device according to some embodiments of the inventive concept.

FIG. 27 illustrates a memory card 1100 including a semiconductor device, according to some embodiments of the inventive concept.

The memory card 1100 may include a memory device 1110 and a memory controller 1120.

The memory device 1110 may store data. According to embodiments of the inventive concept, the memory device 1110 may be non-volatile such that stored data is retained even when power supply is interrupted. The memory device 1110 may include the semiconductor devices described above.

The memory controller 1120 may read data stored in the memory device 1110 in response to a read/write request by the host 1130 or may store data of the memory device 1110. The memory controller 1120 may include at least one of the semiconductor devices described above.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a plurality of pattern structures that are spaced apart from one another on a support layer and protrude from the support layer in a vertical direction, wherein the plurality of pattern structures comprise respective insulating spacers having an upper width smaller than a lower width;
   a plurality of insulating extension patterns on the respective insulating spacers, wherein an upper width of the plurality of insulating extension patterns is greater than a lower width of the plurality of insulating extension patterns;
   a plurality of contact patterns on the support layer between the plurality of pattern structures, wherein the plurality of contact patterns are spaced apart from the plurality of insulating extension patterns in the vertical direction; and
   a plurality of conductive patterns on upper and lateral surfaces of respective ones of the plurality of pattern structures and electrically connected to respective ones of the plurality of contact patterns.

2. The semiconductor device of claim 1, wherein each of the insulating spacers comprises a multi-layer spacer including an air spacer.

3. The semiconductor device of claim 1, wherein each of the plurality of insulating extension patterns comprises an extension spacer.

4. The semiconductor device of claim 1, wherein each of the plurality of insulating extension patterns is on upper portions of the respective ones of the plurality of pattern structures, and
   wherein each of the plurality of conductive patterns separates the respective ones of the plurality of contact patterns from respective ones of the plurality of insulating extension patterns.

5. A semiconductor device comprising:
   a plurality of word lines that extend on a substrate along a first direction and are spaced apart from one another in a second direction that is different from the first direction;
   a plurality of bit line structures that extend in the second direction and are spaced apart from one another in the first direction;
   a plurality of insulating spacers on respective ones of the plurality of bit line structures, wherein an upper width of the plurality of insulating spacers is smaller than a lower width of the plurality of insulating spacers;
   a plurality of contact patterns spaced apart from one another on the substrate between the plurality of word lines and between the plurality of bit line structures;
   a plurality of insulating extension spacers on respective ones of the plurality of insulating spacers, wherein an upper width of the plurality of insulating of insulating extension spacers is greater than a lower width of the plurality of insulating extension spacers; and
   a plurality of conductive landing pads that are on upper and lateral surfaces of respective ones of the plurality of bit line structures, the respective ones of the plurality of insulating spacers, and respective ones of the plurality of extension spacers and are electrically connected to respective ones of the plurality of contact patterns, wherein the plurality of conductive landing pads are alternately on right and left sidewalls of each of the plurality of bit line structures along the second direction, and
   wherein each of the plurality of conductive landing pads overlaps only a respective one of the plurality of bit line structures.

6. A semiconductor device comprising:
   first and second pattern structures on a support layer, wherein the first and second pattern structures are spaced apart from each other in a first direction and extend in a second direction that is different from the first direction, wherein an upper width of the first and second pattern structures in the first direction is smaller than a lower width of the first and second pattern structures in the first direction, and wherein the first and second pattern structures protrude from the support layer in a vertical direction;
   a plurality of extension patterns that extend on two sidewalls of each of the first and second pattern structures that extend in the second direction, wherein an upper width of the plurality of extension patterns in the first direction is greater than a lower width of the plurality of extension patterns in the first direction; and
   a first conductive pattern that is on upper and lateral surfaces of the first pattern structure and is on upper and lateral surfaces of a first one of the plurality of extension patterns that is on one of the two sidewalls of the first pattern structure, wherein the first conductive pattern comprises a lower portion between the first and second pattern structures and an upper portion protruding from the lower portion in the vertical direction, wherein the upper portion of the first conductive pattern extends on the lateral surface of the first pattern structure and overlaps the upper surface of the first pattern structure, and wherein a portion of the upper portion of the first conductive pattern that extends on the lateral surface of the first pattern structure is spaced apart from a second one of the plurality of extension patterns that is on one of the two sidewalls of the second pattern structure facing the first pattern structure.

7. The semiconductor device of claim 6, wherein each of the first and second pattern structures comprises a body conductive pattern and an insulation pattern on the body conductive pattern, and one of the plurality of extension patterns is on an upper portion of a sidewall of one of the insulation patterns.

8. The semiconductor device of claim 6, wherein the first and second pattern structures comprise bit lines, and ones of the plurality of extension patterns comprise insulating spacers on respective sidewalls of the bit lines.

9. The semiconductor device of claim 6, wherein the first and second pattern structures comprise bit lines, and wherein a buried contact is provided on the support layer between the bit lines and contacts the first conductive pattern.

10. The semiconductor device of claim 9, wherein an uppermost surface of the buried contact is spaced apart from lowermost surfaces of the plurality of extension patterns in the vertical direction.

11. The semiconductor device of claim 9, wherein the lower portion of the first conductive pattern contacts a lower surface of the first one of the plurality of extension patterns, and wherein a width of the lower portion of the first conductive pattern in the first direction is equal to a width of the buried contact in the first direction.

12. The semiconductor device of claim 6, further comprising a second conductive pattern that is on upper and lateral surfaces of the second pattern structure and is on upper and lateral surfaces of the second one of the plurality of extension patterns that is on the one of the two sidewalls of the second pattern structure, wherein the second conductive pattern is spaced apart from the first conductive pattern in the second direction, wherein the second conductive pattern comprises a lower portion between the first and second pattern structures and an upper portion protruding from the lower portion of the second conductive pattern in the vertical direction, wherein the upper portion of the second conductive pattern extends on the lateral surface of the second pattern structure and overlaps the upper surface of the second pattern structure, and wherein a portion of the upper portion of the second conductive pattern that extends on the lateral surface of the second pattern structure is spaced apart from the first one of the plurality of extension patterns that is on the one of the two sidewalls of the first pattern structure.

13. The semiconductor device of claim 12, wherein the upper portion of the first conductive pattern does not overlap the upper surface of the second pattern structure, and wherein the upper portion of the second conductive pattern does not overlap the upper surface of the first pattern structure.

14. The semiconductor device of claim 1, wherein the plurality of pattern structures comprise a first pattern structure and a second pattern structure that are spaced apart from each other and are directly adjacent to each other, wherein the plurality of conductive patterns comprise a first conductive pattern comprising a lower portion that is between the first and second pattern structures, wherein the plurality of insulating extension patterns comprise a first insulating extension pattern that is between the first and second pattern structures, and a lower surface of the first insulating extension pattern contacts the lower portion of the first conductive pattern, and wherein the plurality of contact patterns comprise a first contact pattern that is between the first and second pattern structures, and a width of the first contact pattern is equal to a width of the lower portion of the first conductive pattern.

15. The semiconductor device of claim 1, wherein the plurality of pattern structures comprise a first pattern structure and a second pattern structure that are spaced apart from each other and are directly adjacent to each other, wherein the plurality of conductive patterns comprise a first conductive pattern that comprises a lower portion between the first and second pattern structures and an upper portion that overlaps an upper surface of the first pattern structure, and wherein the upper portion of the first conductive pattern does not overlap an upper surface of the second pattern structure.

16. The semiconductor device of claim 15, wherein the plurality of conductive patterns comprise a second conductive pattern that comprises a lower portion between the first and second pattern structures and an upper portion that overlaps the upper surface of the second pattern structure, and wherein the upper portion of the second conductive pattern does not overlap the upper surface of the first pattern structure.

17. The semiconductor device of claim 16, wherein the first and second pattern structures extend longitudinally in a horizontal direction, and wherein the first conductive pattern is spaced apart from the second conductive pattern in the horizontal direction and is directly adjacent to the second conductive pattern.

18. The semiconductor device of claim 16, wherein the upper portion of the first conductive pattern is closer to the first pattern structure than the second pattern structure, and wherein the upper portion of the second conductive pattern is closer to the second pattern structure than the first pattern structure.

19. The semiconductor device of claim 5, wherein the plurality of bit line structures comprise a first bit line structure and a second bit line structure, and the first and second bit line structures extend in the second direction and are spaced apart from each other in the first direction, wherein the plurality of conductive landing pads comprise a first landing pad and a second landing pad, and the first and second landing pads are spaced apart from each other in the second direction, wherein the first landing pad comprises a first lower portion between the first and the second bit line structures and a first upper portion that is closer to the first bit line structure than the second bit line structure and overlaps the first bit line structure, and wherein the second landing pad comprises a second lower portion between the first and the second bit line structures and a second upper portion that is closer to the second bit line structure than the first bit line structure and overlaps the second bit line structure.

20. The semiconductor device of claim 5, wherein the plurality of bit line structures comprise a first bit line structure and a second bit line structure, and the first and second bit line structures extend in the second direction and are spaced apart from each other in the first direction, wherein the plurality of conductive landing pads comprise a first landing pad that comprises a lower portion between the first bit line structure and the second bit line structure, wherein the plurality of insulating extension spacers comprise a first extension spacer that is between the first bit line structure and the second bit line structure, and a lower surface of the first extension spacer contacts the lower portion of the first landing pad, and wherein the plurality of contact patterns comprise a first contact pattern that is between the first bit line structure and the second bit line structure, and a width of the first contact pattern in the first direction is equal to a width of the lower portion of the first landing pad in the first direction.

* * * * *